(12) United States Patent
Balkey et al.

(10) Patent No.: US 12,413,884 B2
(45) Date of Patent: Sep. 9, 2025

(54) CONTACT STRUCTURES OF LED CHIPS FOR CURRENT INJECTION

(71) Applicant: CreeLED, Inc., Durham, NC (US)

(72) Inventors: Seth Joseph Balkey, Durham, NC (US); Steven Wuester, Wake Forest, NC (US); Michael Check, Holly Springs, NC (US)

(73) Assignee: CreeLED, Inc., Durham, NC (US)

( * ) Notice: Subject to any disclaimer, the term of this patent is extended or adjusted under 35 U.S.C. 154(b) by 756 days.

(21) Appl. No.: 17/669,663

(22) Filed: Feb. 11, 2022

(65) Prior Publication Data

US 2023/0261157 A1    Aug. 17, 2023

(51) Int. Cl.
*H01L 25/075* (2006.01)
*G10L 15/26* (2006.01)
(Continued)

(52) U.S. Cl.
CPC .............. *H04R 1/04* (2013.01); *G10L 15/26* (2013.01); *G10L 15/28* (2013.01);
(Continued)

(58) Field of Classification Search
CPC ..... H01L 33/60; H01L 33/62; H01L 25/0753; H10H 20/857; H10H 20/856; H04R 1/04; H04R 1/025; G10L 15/26; G10L 15/28
(Continued)

(56) References Cited

U.S. PATENT DOCUMENTS

| 6,410,942 B1 | 6/2002 | Thibeault et al. |
| 10,529,696 B2 | 1/2020 | Edmond et al. |

(Continued)

FOREIGN PATENT DOCUMENTS

| JP | 2015188109 A | 10/2015 |
| TW | 202118117 A | 5/2021 |

OTHER PUBLICATIONS

International Search Report and Written Opinion for International Patent Application No. PCT/US2023/062200, mailed Jun. 21, 2023, 15 pages.

(Continued)

*Primary Examiner* — Igwe U Anya
(74) *Attorney, Agent, or Firm* — Withrow & Terranova, P.L.L.C.

(57) ABSTRACT

Light-emitting diodes (LEDs), and more particularly contact structures of LED chips for improved current injection are disclosed. Exemplary LED chips include an n-contact structure that forms part of a cathode connection. N-contact structures are provided that form a grid structure that is electrically coupled at an n-type layer across the LED chip so that current is coupled to and spread along the n-type layer. N-contact structures are provided that reside along streets formed between active LED structure mesas. N-contact structures are provided that are embedded within one or more layers of an LED chip, including reflective layers and/or dielectric layers. By providing such n-contact structures along the n-type layer, increased contact between the n-type layer and the n-contact structure may promote improved current spreading and/or current injection while also providing increased thermal spreading in LED chips. Additionally, increased edge profiles of active LED structure mesas may provide increased light extraction.

31 Claims, 21 Drawing Sheets

(51) Int. Cl.
 *G10L 15/28*     (2013.01)
 *H04R 1/02*     (2006.01)
 *H04R 1/04*     (2006.01)
 *H10H 20/856*    (2025.01)
 *H10H 20/857*    (2025.01)

(52) U.S. Cl.
 CPC ......... *H01L 25/0753* (2013.01); *H04R 1/025* (2013.01); *H10H 20/856* (2025.01); *H10H 20/857* (2025.01)

(58) Field of Classification Search
 USPC .......................................................... 257/72
 See application file for complete search history.

(56) References Cited

U.S. PATENT DOCUMENTS

| | | | |
|---|---|---|---|
| 10,879,441 B2 | 12/2020 | Check | |
| 10,985,294 B2 | 4/2021 | White | |
| 11,094,848 B2 | 8/2021 | Breva et al. | |
| 2014/0231839 A1* | 8/2014 | Jeon | H01L 33/382 257/96 |
| 2015/0144984 A1 | 5/2015 | Chen et al. | |
| 2018/0130926 A1 | 5/2018 | Huang et al. | |
| 2019/0237630 A1* | 8/2019 | Check | H01L 33/382 |
| 2021/0020806 A1* | 1/2021 | Dimitropoulos | H01L 33/20 |
| 2021/0126160 A1 | 4/2021 | Andrews | |
| 2021/0391506 A1 | 12/2021 | Leber et al. | |
| 2023/0261157 A1 | 8/2023 | Balkey et al. | |

OTHER PUBLICATIONS

Notice of Allowance for Taiwanese Patent Application No. 112103008, mailed May 15, 2024, 3 pages.

Preliminary Examination Report for Taiwanese Patent Application No. 112103008, mailed Nov. 2, 2023, 20 pages.

* cited by examiner

CONTACT STRUCTURES OF LED CHIPS FOR CURRENT INJECTION

FIELD OF THE DISCLOSURE

The present disclosure relates to light-emitting diodes (LEDs), and more particularly to contact structures of LED chips for improved current injection.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An active region may be fabricated, for example, from silicon carbide, gallium nitride, gallium phosphide, aluminum nitride, and/or gallium arsenide-based materials and/or from organic semiconductor materials. Photons generated by the active region are initiated in all directions.

Typically, it is desirable to operate LEDs at the highest light emission efficiency, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection and current injection. To reduce internal reflection, it has been found useful to pattern, roughen, or otherwise texture the interface between an LED surface and the surrounding environment to provide a varying surface that increases the probability of refraction over internal reflection. Reflective surfaces may also be provided to reflect generated light so that such light may contribute to useful emission from an LED chip. To increase current spreading and current spreading within an LED chip, and in particular for larger area LED chips, it has been found useful to add layers of high electrical conductivity over one or more epitaxial layers of an LED. Additionally, electrodes for the LEDs can have larger surface areas and may include various electrode arrangements that are configured to route and more evenly distribute current across an LED.

As advancements in modern LED technology progress, the art continues to seek improved LEDs and solid-state lighting devices having desirable illumination characteristics capable of overcoming challenges associated with conventional lighting devices.

SUMMARY

The present disclosure relates to light-emitting diodes (LEDs), and more particularly to contact structures of LED chips for improved current injection. Exemplary LED chips include an n-contact structure that forms part of a cathode connection. The n-contact structure may form a grid structure that is electrically coupled at an n-type layer across the LED chip so that current may be coupled to the n-type layer and effectively spread along the n-type layer. The n-contact structure may reside along streets formed between active LED structure mesas. The n-contact structure may be embedded within one or more layers of an LED chip, including reflective layers and/or dielectric layers. By providing such an n-contact structure along the n-type layer, increased contact between the n-type layer and the n-contact structure may promote improved current spreading and/or current injection while also providing increased thermal spreading in LED chips.

In one aspect, an LED chip comprises: an active LED structure comprising an n-type layer, a p-type layer, and an active layer arranged between the n-type layer and the p-type layer; a reflective structure on the active LED structure, wherein the reflective structure comprises a dielectric layer, a metal layer, and a plurality of reflective layer interconnects that extend through the dielectric layer to electrically couple the metal layer to the p-type layer; and an n-contact structure electrically coupled to the n-type layer, wherein the n-contact structure is arranged between the n-type layer and at least a portion of the dielectric layer of the reflective structure. In certain embodiments, the p-type layer, the active layer, and a first portion of the n-type layer form an active LED structure mesa with at least one street formed by a second portion of the n-type layer that is outside the active LED structure mesa; and at least a portion of the n-contact structure is arranged on the at least one street. In certain embodiments, the p-type layer, the active layer, and the n-type layer form a plurality of active LED structure mesas that are separated by a plurality of streets formed by portions of the n-type layer that are outside the plurality of active LED structure mesas; and at least a portion of the n-contact structure forms an n-contact grid that resides in the plurality of streets. In certain embodiments, the dielectric layer of the reflective structure is arranged to laterally extend across one or more streets of the plurality of streets. In certain embodiments, the n-contact grid forms a repeating pattern across the n-type layer. In certain embodiments, reflective layer interconnects of the plurality of reflective layer interconnects arranged along each active LED mesa are arranged with different diameters from one another. In certain embodiments, the plurality of active LED structure mesas are electrically coupled in parallel with one another. In certain embodiments, one or more active LED structure mesas of the plurality of active LED structure mesas are configured to be electrically activated and deactivated independently of one another.

The LED chip may further comprise an n-contact electrically coupled to the n-type layer; a p-contact electrically coupled to the p-type layer; and a passivation layer arranged between the n-contact and the active LED structure and between the p-contact and the active LED structure. The LED chip may further comprise a plurality of p-contact interconnects that form electrically conductive paths through the passivation layer to electrically couple the p-contact to the metal layer; and a plurality of n-contact interconnects that form electrically conductive paths through the passivation layer to electrically couple the n-contact to the n-contact structure. The LED chip may further comprise an interlayer that is embedded within the passivation layer such that the interlayer is electrically isolated from the n-contact and the p-contact, wherein a peripheral edge of the interlayer is arranged closer to an n-contact interconnect of the plurality of n-contact interconnects than a peripheral edge of the metal layer.

In another aspect, an LED chip comprises: an active LED structure comprising an n-type layer, a p-type layer, and an active layer arranged between the n-type layer and the p-type layer; an n-contact electrically coupled to the n-type layer; a p-contact electrically coupled to the p-type layer; and an n-contact grid electrically coupled between the n-contact and the n-type layer, wherein a portion of the n-contact grid is arranged between the n-type layer and the p-contact. The LED chip may further comprise a dielectric layer on the n-contact grid such that at least a portion of the dielectric layer is arranged between the n-contact grid and the p-contact. In certain embodiments, the dielectric layer forms a portion of a reflective structure, wherein the reflective structure further comprises a metal layer and a plurality of reflective layer interconnects that extend through the dielectric layer to electrically couple the metal layer to the p-type layer. In certain embodiments, the p-type layer, the active layer, and the n-type layer form a plurality of active LED structure mesas that are separated by a plurality of streets formed by portions of the n-type layer that are outside the plurality of active LED structure mesas; and the n-contact grid resides in the plurality of streets. The LED chip may further comprise at least one n-contact interconnect that is electrically coupled between the n-contact and the n-contact grid. In certain embodiments, the dielectric layer laterally extends from the plurality of active LED structure mesas across the plurality of streets. In certain embodiments, the n-contact grid forms a repeating pattern across the n-type layer. The LED chip may further comprise a plurality of n-contact interconnects that are electrically coupled between the n-contact and the n-contact grid, wherein the plurality of n-contact interconnects are arranged to contact the n-contact grid at vertices of the repeating pattern. In certain embodiments, the n-contact is accessible from a light-emitting face of the LED chip and the p-contact is accessible from a mounting face of the LED chip that is opposite the light-emitting face. In certain embodiments, the p-contact is accessible from a light-emitting face of the LED chip and the n-contact is accessible from a mounting face of the LED chip that is opposite the light-emitting face.

In another aspect, an LED chip, comprises: an active LED structure comprising an n-type layer, a p-type layer, and an active layer arranged between the n-type layer and the p-type layer, wherein the p-type layer, the active layer, and the n-type layer form a plurality of active LED structure mesas that are separated by a plurality of streets; and an n-contact structure that is arranged within the plurality of streets such that the n-contact structure is electrically coupled to sidewalls of the n-type layer of each active LED structure mesa of the plurality of active LED structure mesas. In certain embodiments, the n-contact structure is arranged entirely through a thickness of the n-type layer. The LED chip may further comprise a plurality of p-contacts, wherein an individual p-contact of the plurality of p-contacts is electrically coupled to an individual active LED structure mesa of the plurality of active LED structure mesas. The LED chip may further comprise a reflective structure on the plurality of active LED structure mesas, wherein the reflective structure comprises: a dielectric layer, a metal layer, and a plurality of reflective layer interconnects that extend through the dielectric layer to electrically couple the metal layer to the p-type layer of each of the plurality of active LED structure mesas. In certain embodiments, the dielectric layer laterally extends across the plurality of streets and the n-contact structure such that the dielectric layer laterally extends between adjacent ones of the plurality of active LED structure mesas. The LED chip may further comprise a substrate on which the active LED structure is provided, wherein the substrate further comprises light-contrasting features that are registered with the plurality of streets. In certain embodiments, the light-contrasting features comprise damaged regions of the substrate. In certain embodiments, the light-contrasting features comprise openings of the substrate. In certain embodiments, the openings of the substrate are filled with a light-absorbing material.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
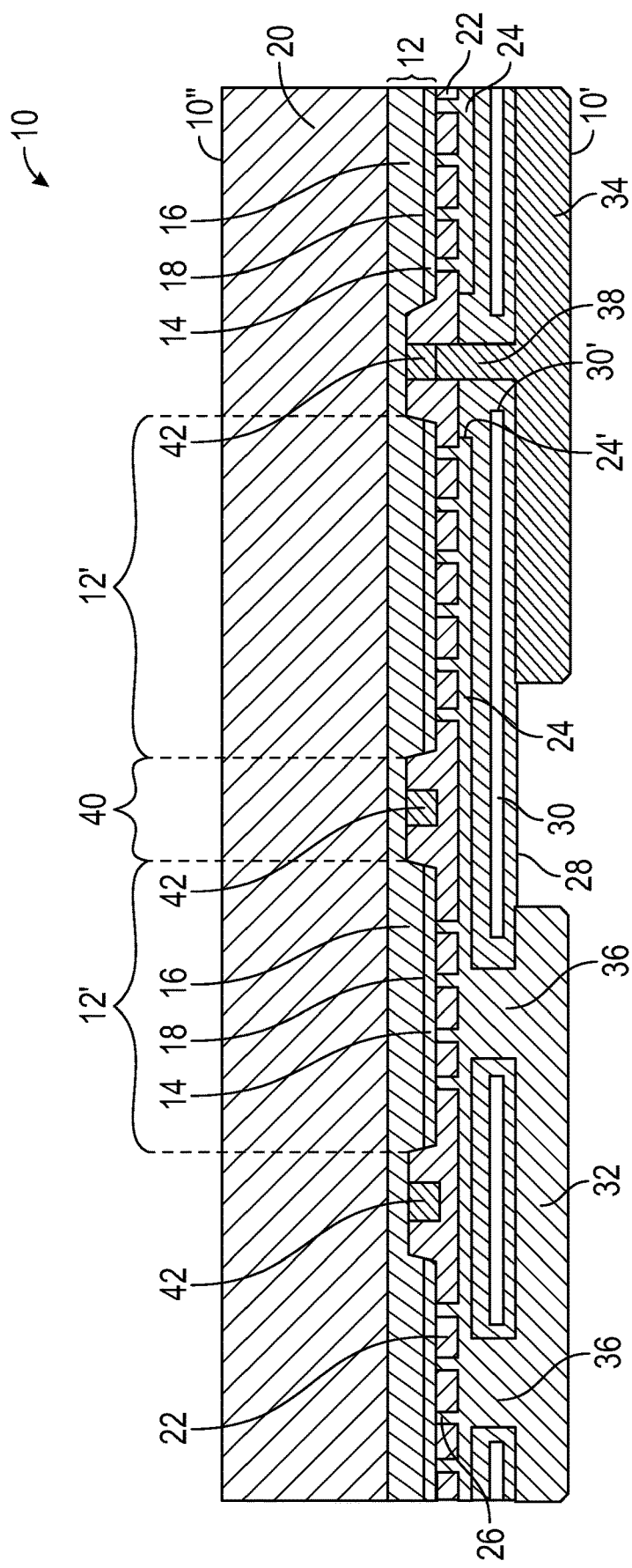
FIG. 1A is a generalized cross-sectional view of a light-emitting diode (LED) chip with an n-contact structure and arranged in a flip-chip configuration according to principles of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to light-emitting diodes (LEDs), and more particularly to contact structures of LED chips for improved current injection. Exemplary LED chips include an n-contact structure that forms part of a cathode connection. The n-contact structure may form a grid structure that is electrically coupled at an n-type layer across the LED chip so that current may be coupled to the n-type layer and effectively spread along the n-type layer. The n-contact structure may reside along streets formed between active LED structure mesas. The n-contact structure may be embedded within one or more layers of an LED chip, including reflective layers and/or dielectric layers. By providing such an n-contact structure along the n-type layer, increased contact between the n-type layer and the n-contact structure may promote improved current spreading and/or current injection while also providing increased thermal spreading in LED chips.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, ALGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. In certain embodiments, the active LED structure may emit blue light with a peak wavelength range of approximately 430 nanometers (nm) to 480 nm. In other embodiments, the active LED structure may emit green light with a peak wavelength range of 500 nm to 570 nm. In other embodiments, the active LED structure may emit red light with a peak wavelength range of 600 nm to 650 nm. In certain embodiments, the active LED structure may be configured to emit light that is outside the visible spectrum, including one or more portions of the ultraviolet (UV) spectrum, the infrared (IR) or near-IR spectrum. The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications. Near-IR and/or IR wavelengths for LED structures of the present disclosure may have wavelengths above 700 nm, such as in a range from 750 nm to 1100 nm, or more.

The LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphor (e.g., YAG:Ce), green phosphor (e.g., LuAg:Ce), and red phosphor (e.g., $Ca_{i-x-y}Sr_xEu_y$-$AlSiN_3$) and combinations thereof. One or more lumiphoric materials may be provided on one or more portions of an LED chip and/or a submount in various configurations. In certain embodiments, one or more surfaces of LED chips may be conformally coated with one or more lumiphoric materials, while other surfaces of such LED chips and/or associated submounts may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

Light emitted by the active layer or region of an LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer is arranged between the metal reflector layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction.

In operation, quantum efficiency of LED chips may be related to a variety of factors, two of which include current injection efficiency and thermal management. Such factors may be of particular importance for larger size LED chips, for example those having lateral dimensions of 500 microns (μm) and above, where current must spread over a larger surface area and the LED chip may generate increased amounts of heat. Current injection across an active LED structure may be provided by electrical connection structures that provide anode and cathode connections for the active LED structure. Anode and cathode connections may include LED chip bond pads that are arranged to receive external electrical connections for the LED chip, and electrically conductive paths between the LED chip bond pads and the active LED structure may be routed by various electrically conductive layers and via structures. According to aspects of the present disclosure, LED chips include an n-contact structure that forms part of the cathode connection. The n-contact structure may form a grid structure that contacts, or in some cases directly contacts, the n-type layer across the active LED chip structure so that current may be coupled to the n-type layer and more effectively spread in a lateral direction along the n-type layer. The n-contact structure may reside along streets formed by one or more active LED structure mesas. By providing such a grid structure along the n-type layer, increased contact between the n-type layer and the n-contact structure may promote improved current spreading and/or current injection while also providing increased thermal spreading for the active LED structure.

FIG. 1A is a generalized cross-sectional view of an LED chip 10 arranged in a flip-chip configuration according to principles of the present disclosure. While a flip-chip configuration is shown, other LED chip structures are also possible without deviating from the principles disclosed. The LED chip 10 includes an active LED structure 12 comprising a p-type layer 14, an n-type layer 16, and an active layer 18 formed on a substrate 20. In certain embodiments, the n-type layer 16 is arranged between the active layer 18 and the substrate 20. In other embodiments, the doping order may be reversed such that layer 16 is doped p-type and layer 14 is doped n-type. The substrate 20 may comprise many different materials such as SiC or sapphire and may have one or more surfaces that are shaped, textured, or patterned to enhance light extraction. In certain embodiments, the substrate 20 is light-transmissive (preferably transparent) to wavelengths of light generated by the active LED structure 12.

In FIG. 1A, a first reflective layer 22 is provided on the p-type layer 14. In certain embodiments, a current spreading layer, such as a thin layer of a transparent conductive oxide such indium tin oxide (ITO) or a metal such as platinum (Pt), may be provided between the p-type layer 14 and the first reflective layer 22. The first reflective layer 22 may comprise many different materials and preferably comprises a material that presents an index of refraction step with the material comprising the active LED structure 12 to promote total internal reflection (TIR) of light generated from the active LED structure 12. Light that experiences TIR may be redirected without experiencing absorption or loss and may thereby contribute to useful or desired LED chip emission. In certain embodiments, the first reflective layer 22 comprises a material with an index of refraction lower than the index of refraction of the active LED structure 12 material. The first reflective layer 22 may comprise many different materials, with some having an index of refraction less than 2.3, while others may have an index of refraction less than 2.15, less than 2.0, and less than 1.5. In certain embodiments the first reflective layer 22 comprises a dielectric material, with certain embodiments comprising silicon dioxide ($SiO_2$) and/or silicon nitride (SiN). It is understood that many dielectric materials may be used such as SiN, SiNx, $Si_3N_4$, Si, germanium (Ge), $SiO_2$, SiOx, titanium dioxide ($TiO_2$), tantalum pentoxide ($Ta_2O_5$), ITO, magnesium oxide (MgOx), zinc oxide (ZnO), and combinations thereof. By providing the first reflective layer 22 as a dielectric layer, the first reflective layer 22 may advantageously be positioned to across the active LED structure 12 without concern for electrical shorting between anode and cathode electrical connections. In certain embodiments, the first reflective layer 22 may include multiple alternating layers of different dielectric materials, e.g., alternating layers of $SiO_2$ and SiN that symmetrically repeat or are asymmetrically arranged. Some Group III nitride materials such as GaN may have an index of refraction of approximately 2.4, $SiO_2$ may have an index of refraction of approximately 1.48, and SiN may have an index of refraction of approximately 1.9. Embodiments with the active LED structure 12 comprising GaN and the first reflective layer 22 comprising $SiO_2$ may have a sufficient index of refraction step between the two materials to allow for efficient TIR of light. A thickness of the first reflective layer 22 may vary depending on the type of materials used, with certain embodiments having a thickness of at least 0.2 μm. In some of these embodiments, the first reflective layer 22 may have a thickness in the range of 0.2 μm to 0.7 μm, while in some of these embodiments it may be approximately 0.5 μm thick.

In FIG. 1A, the LED chip 10 may further include a second reflective layer 24 that is on the first reflective layer 22 such that the first reflective layer 22 is arranged between the active LED structure 12 and the second reflective layer 24. The second reflective layer 24 may include a metal layer that is configured to reflect any light from the active LED structure 12 that may pass through the first reflective layer 22. The second reflective layer 24 may comprise many different materials such as Ag, gold (Au), Al, or combinations thereof. As illustrated, the second reflective layer 24 may include one or more reflective layer interconnects 26 that provide electrically conductive paths through the first reflective layer 22 to electrically couple the second reflective layer 24 to the p-type layer 14. In certain embodiments, the reflective layer interconnects 26 comprise reflective layer vias. Accordingly, the first reflective layer 22, the second reflective layer 24, and the reflective layer interconnects 26 form a reflective structure of the LED chip 10. In certain embodiments, the reflective layer interconnects 26 comprise the same material as the second reflective layer 24 and are formed at the same time as the second reflective layer 24. In other embodiments, the reflective layer interconnects 26 may comprise a different material than the second reflective layer 24. The LED chip 10 may optionally comprise a barrier layer on a portion of the second reflective layer 24 that is opposite the reflective layer interconnects 26 to prevent migration of the second reflective layer 24 material, such as Ag, to other layers. Such a barrier layer may comprise an electrically conductive material, with suitable materials including but not limited to sputtered Ti/Pt followed by evaporated Au bulk material or sputtered Ti/Ni followed by an evaporated Ti/Au bulk material. A passivation layer 28 is included on second reflective layer 24. The passivation layer 28 is arranged to protect and provide electrical insulation for the LED chip 10 and may comprise many different materials, such as a dielectric material. In certain embodiments, the passivation layer 28 is a single layer, and in other embodiments, the passivation layer 28 comprises a plurality of layers. A suitable material for the passivation layer 28 includes but is not limited to silicon nitride. In certain embodiments, the passivation layer 28 includes a metal-containing interlayer 30 arranged therein, wherein the interlayer 30 may comprise Al or another suitable metal. Notably, the interlayer 30 is embedded within the passivation layer 28 and is electrically isolated from the rest of the LED chip 10. In application, the interlayer 30 may function as a crack stop layer for any cracks that may propagate through the passivation layer 28.

In FIG. 1A, the LED chip 10 includes a p-contact 32 and an n-contact 34 that are arranged on the passivation layer 28 and are configured to receive external electrical connections and provide portions of electrically conductive paths to the active LED structure 12. The p-contact 32, which may also be referred to as an anode contact, may comprise one or more p-contact interconnects 36 that extend through the passivation layer 28 to provide an electrically conductive path to the p-type layer 14 by way of the second reflective layer 24 and the reflective layer interconnects 26. In certain embodiments, the one or more p-contact interconnects 36 comprise one or more p-contact vias. The n-contact 34, which may also be referred to as a cathode contact, may comprise one or more n-contact interconnects 38 that extend through the passivation layer 28, the second reflective layer 24, and the first reflective layer 22 to provide an electrical path to the n-type layer 16. In certain embodiments, the one or more n-contact interconnects 38 comprise one or more n-contact vias.

In certain embodiments, the interlayer 30 may laterally extend to form a peripheral edge 30' that is closer to the n-contact interconnect 38 than a peripheral edge 24' of the second reflective layer 24, thereby providing increased protection for any cracks that may propagate toward the n-contact interconnect 38 and/or the n-contact 34. Additionally, the interlayer 30 may reflect at least some light from the active LED structure 12 if such light was able to pass through both the first reflective layer 22 and the second reflective layer 24.

As illustrated in FIG. 1A, multiple active LED structure mesas 12' are formed in the active LED structure 12, with streets 40 formed therebetween. Each active LED structure mesa 12' may be formed by the p-type layer 14, the active layer 18, and first portions of the n-type layer 16. The streets 40 correspond with second portions of the n-type layer 16 that are outside the active LED structure mesas 12'. An n-contact structure 42 is provided to contact the n-type layer 16 at the streets 40. The n-contact structure 42 may comprise an electrically and thermally conductive metal layer or metal layers on the n-type layer 16. In certain embodiments, the n-contact structure 42 may from an n-contact grid with extensions that interconnect with one another across the active LED structure 12. In the cross-section of FIG. 1A, three portions of the n-contact structure 42 are illustrated in three of the streets 40. In this regard, all three portions of the n-contact structure 42 are electrically coupled to one another by other portions of the n-contact structure 42 that laterally extend on the n-type layer 16 in corresponding streets 40 that are not visible in the cross-section of FIG. 1A. Such an interconnected structure is more readily visible in the bottom view provided in FIG. 1B, which will be described in greater detail below. In certain embodiments, the streets 40 with corresponding portions of the interconnected n-contact structure 42 may entirely surround the active LED structure mesas 12', thereby forming discontinuous portions of the active layer 18 and the p-type layer 14 across the LED chip 10. The n-contact structure 42 may provide a portion of a common cathode connection for each of the active LED structure mesas 12' while the second reflective layer 24 and reflective layer interconnects 26 may form portions of a common anode connection for the each of the active LED structure mesas 12'. In this manner, the active LED structure mesas 12' may be electrically coupled in parallel between the n-contact 34 and the p-contact 32.

As further illustrated in FIG. 1A, an electrically conductive path between the n-contact 34 and the n-contact structure 42 is provided by the n-contact interconnect 38. Since the n-contact structure 42 is laterally interconnected along various streets 40, not all portions of the n-contact structure 42 need to be directly contacted by other n-contact interconnects 38. In this manner, portions of the first reflective layer 22 may be arranged to cover portions of the n-contact structure 42 in streets 40 that are not directly connected to n-contact interconnects 38. In this manner, the n-contact structure 42 may be arranged along portions of the LED chip 10 that are not typically accessible for electrical connections to the n-type layer 16, such as between the n-type layer 16 and the p-contact 32 and/or between the n-type layer 16 and extensions of the reflective structure that covers the p-type layer 14. For example, portions of the reflective structure formed by the first reflective layer 22 and the second reflective layer 24 may laterally extend past the active LED structure mesas 12' and across various ones of the streets 40 with corresponding portions of the n-contact structure 42. In this manner, the reflective structure may cover more of the LED chip 10 for increased light extraction. As described above, the first reflective layer 22 is a dielectric layer in certain embodiments, thereby providing electrical insulation between the n-contact structure 42 and other portions of the LED chip 10, such as the second reflective layer 24. In this regard, the first reflective layer 22 may effectively serve to encapsulate and provide electrical insulation for portions of the n-contact structure 42 that are not directly connected to n-contact interconnects 38. By forming the n-contact structure 42 as an interconnected grid that laterally extends along the n-type layer 16 and across the active LED structure 12, increased current spreading and/or current injection may be realized. Additionally, the presence of the n-contact structure 42 may further provide increased thermal spreading for heat generated by the active LED structure 12.

In operation, a signal applied across the p-contact 32 and the n-contact 34 is conducted to the p-type layer 14 and the n-type layer 16, causing the LED chip 10 to emit light from the active layer 18. The p-contact 32 and the n-contact 34 may comprise many different materials such as Au, copper (Cu), nickel (Ni), In, Al, Ag, tin (Sn), Pt, or combinations thereof. In still other embodiments, the p-contact 32 and the n-contact 34 may comprise conducting oxides and transparent conducting oxides such as ITO, nickel oxide (NiO), ZnO, cadmium tin oxide, indium oxide, tin oxide, magnesium oxide, $ZnGa_2O_4$, $ZnO_2$/Sb, $Ga_2O_3$/Sn, $AgInO_2$/Sn, $In_2O_3$/Zn, $CuAlO_2$, LaCuOS, $CuGaO_2$, and $SrCu_2O_2$. The choice of material used may depend on the location of the contacts and on the desired electrical characteristics, such as transparency, junction resistivity, and sheet resistance.

As illustrated, the LED chip 10 may be arranged for flip-chip mounting such that the p-contact 32 and n-contact 34 are configured to be mounted or bonded to an external surface, such as a printed circuit board. In this regard, the LED chip 10 includes a mounting face 10' that is configured to be mounted to the external surface, and a primary light-emitting face 10" that is opposite the mounting face 10'. In certain embodiments, the primary light-emitting face 10" comprises the substrate 20, and light emitted from the active layer 18 primarily exits the LED chip 10 through the substrate 20. In other embodiments, the substrate 20 may be removed or replaced. By arranging the n-contact structure 42 between the n-type layer 16 and the mounting face 10', the n-contact structure 42 may be arranged outside, or below, a direct path of light from the active layer 18 to the primary light-emitting face 10" to avoid any light absorption. Additionally, the n-contact structure 42 may comprise a metal layer or metal layers that along with the reflective structure may reflect light from the active layer 18 that may travel toward the mounting face 10'.

Figure 1B:
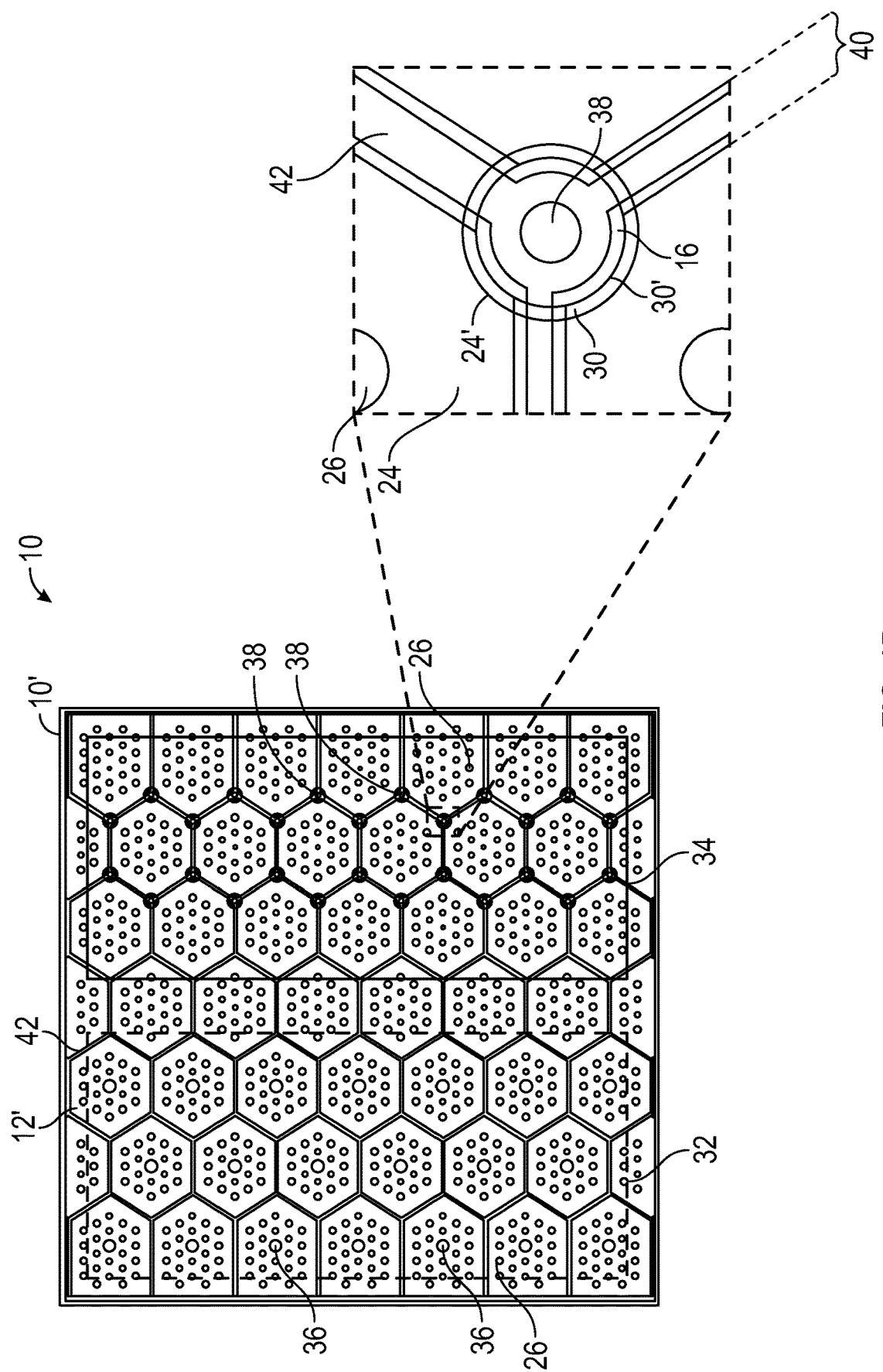
FIG. 1B is a corresponding bottom view of the LED chip of FIG. 1A from the perspective of a mounting face of the LED chip such that the n-contact structure is visible across the LED chip.

FIG. 1B is a corresponding bottom view of the LED chip 10 of FIG. 1A from the perspective of the mounting face 10' of the LED chip 10 such that the n-contact structure 42 is visible across the LED chip 10. FIG. 1B also includes an expanded view of a portion of the LED chip 10 that is centered on a certain one of the n-contact interconnects 38. For illustrative purposes, outlines of the p-contact 32 and the n-contact 34 are shown so that other portions of the LED chip 10 may be visible. As illustrated, the n-contact structure 42 forms an interconnected grid across the LED chip 10 such that individual active LED structure mesas 12' are formed. In FIG. 1B, each of the active LED structure mesas 12' are formed in the shape of a hexagon and collectively, the active LED structure mesas 12' are arranged in a repeating pattern, such as a honeycomb pattern across the n-type layer (16 of FIG. 1A) of the LED chip 10. In this regard, the active LED structure mesas 12' may be tightly packed across the LED chip 10 to provide increased light-emitting portions of the active LED structure 12. However, the nature of forming the streets 40 that define the active LED structure mesas 12' is suitable for forming other shapes for the active LED structure mesas 12', including squares, rectangles, and circular shapes. Since the n-contact structure 42 is formed in the streets 40, the n-contact structure 42 may form a shape or pattern that corresponds with the active LED structure mesas 12'.

As illustrated in FIG. 1B, the p-contact interconnects 36 may be arranged to contact certain ones of the active LED structure mesas 12' that are registered with the p-contact 32. In this regard, electrical connections from the p-contact 32 for the other active LED structure mesas 12' may be provided by lateral coverage of the second reflective layer 24 from active LED structure mesas 12' that are registered with the p-contact interconnects 36 to other active LED structure mesas 12' that are not registered with the p-contact interconnects 36. In this regard, the second reflective layer 24 effectively forms an electrical connection that bridges gaps formed by the streets 40. The reflective layer interconnects 26 may form patterns along each of the active LED structure mesas 12' for providing current spreading across each of the active LED structure mesas 12'.

The n-contact interconnects 38 may be arranged to contact certain portions of the n-contact structure 42 that are registered with the n-contact 34. As best visible in the expanded portion of FIG. 1B, each n-contact interconnect 38 is arranged to contact portions of the n-contact structure 42 that reside within the streets 40. When the active LED structure mesas 12' form a shape, such as a repeating pattern, or a honeycomb pattern, the n-contact structure 42 may also form a corresponding repeating pattern. In certain embodiments, the n-contact interconnect 38 is arranged to contact the n-contact structure 42 at one or more vertices of a hexagon shape of the n-contact structure 42, thereby arranging each n-contact interconnect 38 in close proximity to multiple active LED structure mesas 12' that are adjacent to one another. In the example of FIG. 1B where the active LED structure mesas 12' are formed in the shape of a repeating pattern of hexagons within the honeycomb pattern, a single one of the n-contact interconnects 38 may be arranged at a vertex that is shared by three of the active LED structure mesas 12' to provide increased current spreading. In other embodiments, the n-contact interconnects 38 may be arranged at other locations, such as sides of the hexagons that are between the vertices. With continued reference to the expanded portion of FIG. 1B, the second reflective layer 24 of the reflective structure covers portions of the n-contact structure 42 outside of the n-contact interconnect 38. For example, peripheral edges 24' of the second reflective layer 24 may form circular shapes that individually surround each of the n-contact interconnects 38. In certain embodiments where the interlayer 30 is present, the peripheral edge 30' of the interlayer 30 may also form a circular shape that is arranged closer to the n-contact interconnect 38 than the peripheral edge 24' of the second reflective layer 24.

Figure 2A:
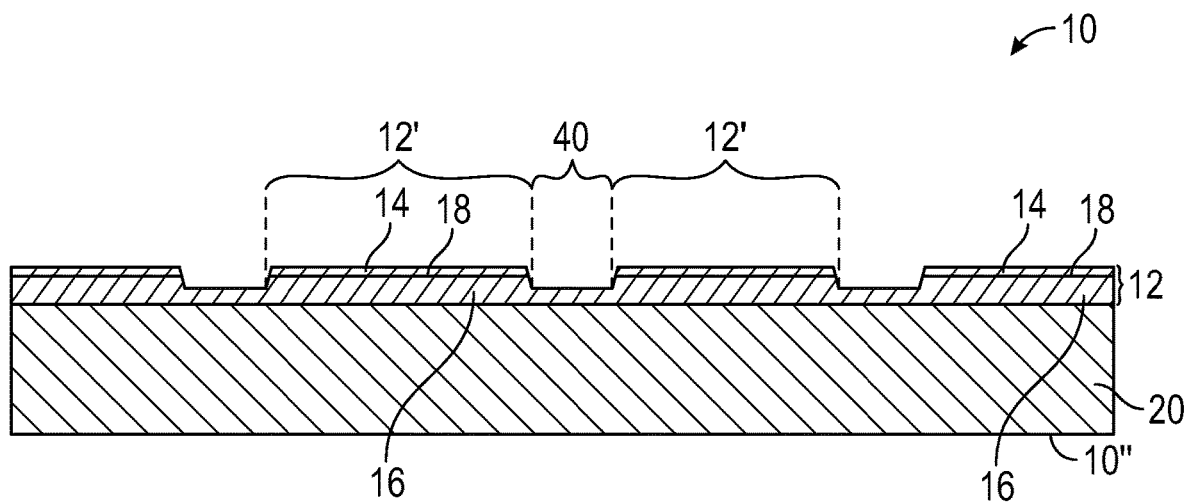
FIG. 2A illustrates a cross-sectional view of the LED chip of FIG. 1A at an initial fabrication step where active LED structure mesas and corresponding streets are formed.
Figure 2B:
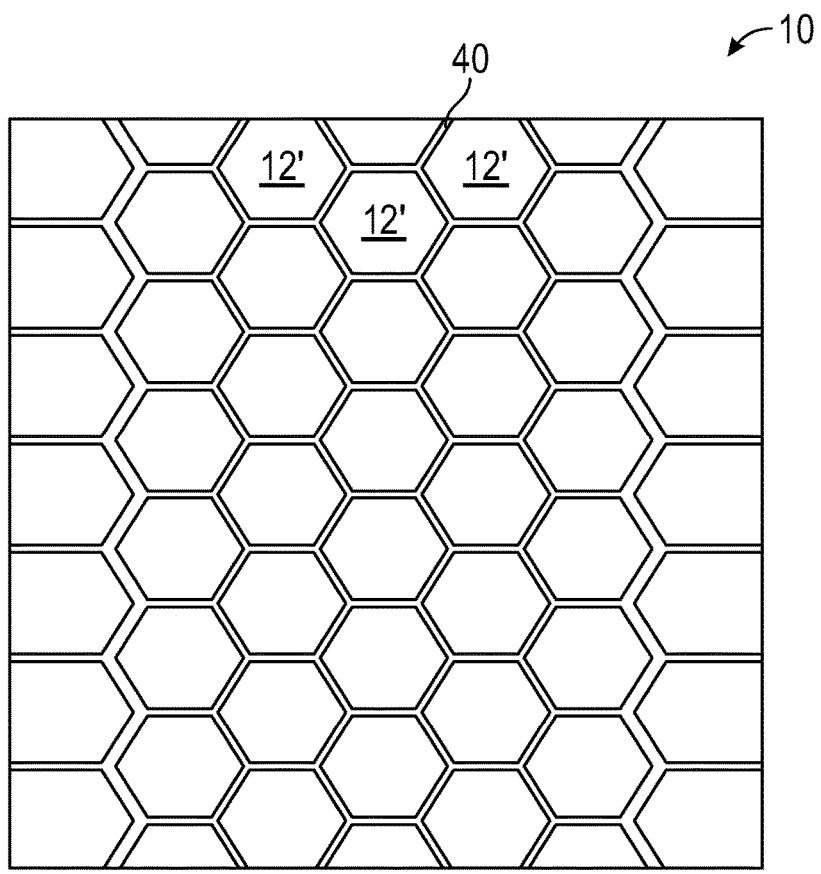
FIG. 2B illustrates a corresponding bottom view of the LED chip of FIG. 2A at the same fabrication step.

FIGS. 2A to 8B illustrate various stages of fabrication for the LED chip 10 of FIGS. 1A and 1B. Each fabrication step for the LED chip 10 is illustrated with a generalized cross-sectional view of the LED chip 10 in a manner similar to FIG. 1A and a corresponding bottom view of the LED chip 10 in a manner similar to FIG. 1B. For example, FIG. 2A illustrates a cross-sectional view of the LED chip 10 at an initial fabrication step and corresponding FIG. 2B illustrates a bottom view of the LED chip 10 at the same fabrication step as FIG. 2A. Accordingly, FIGS. 2A to 8B represent an exemplary seven steps in a fabrication sequence for the LED chip 10. While seven steps are illustrated, it is appreciated that the LED chip 10 may be fabricated with fabrication sequences that include different numbers of steps. In the exemplary fabrication sequence of FIGS. 2A to 8B, hexagonal shaped active LED structure mesas 12' are provided in a honeycomb arrangement. However, the exemplary fabrication sequence of FIGS. 2A to 8B could equally be followed to form other shapes for the active LED structure mesas 12', including hexagonal shapes that do not form a honeycomb structure, squares that may form a grid, rectangles that may form a grid, circular shapes, and repeating patterns thereof.

In the cross-sectional view of FIG. 2A, the streets 40 are formed on the active LED structure 12 to define the active LED structure mesas 12'. The streets 40 may be formed by a selective removal process, such as patterned etching of the active LED structure 12. As illustrated, multiple active LED structure mesas 12' may be formed such that each active LED structure mesa 12' includes an isolated portion of the p-type layer 14, an isolated portion of the active layer 18, and a portion of the n-type layer 16. The streets 40 between the active LED structure mesas 12' may be formed by portions of the n-type layer 16 that extend between the active LED structure mesas 12'. Accordingly, the n-type layer 16 may be continuous between each of the active LED structure mesas 12'.

Figure 3A:
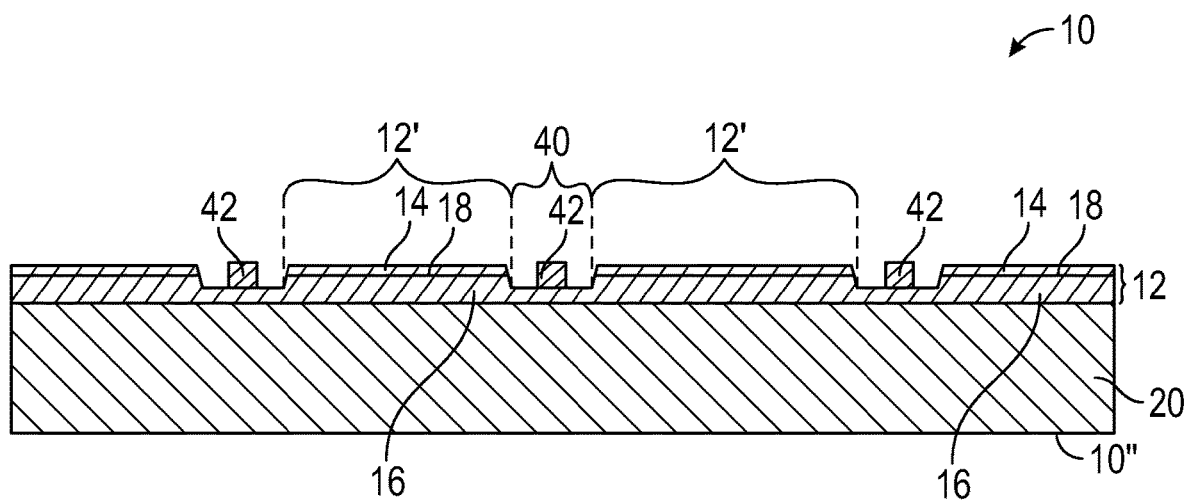
FIG. 3A illustrates a cross-sectional view of the LED chip of FIG. 2A at a subsequent fabrication step where the n-contact structure is formed along the streets.
Figure 3B:
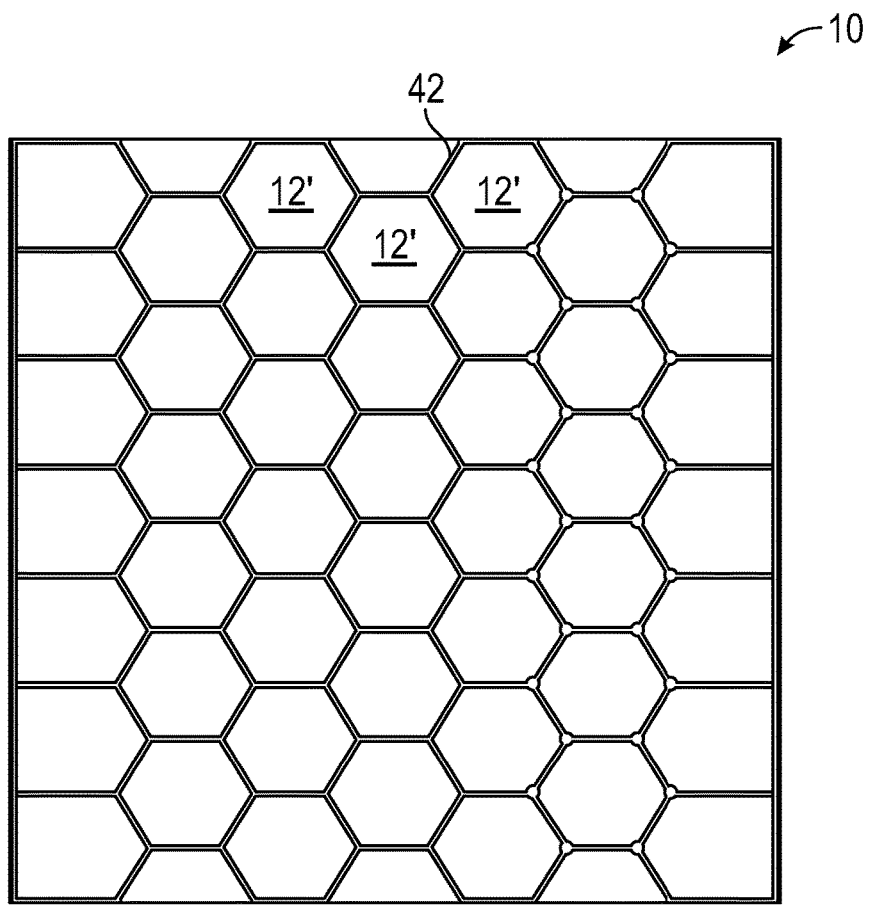
FIG. 3B illustrates a corresponding bottom view of the LED chip of FIG. 3A at the same fabrication step.

In FIG. 3A, the n-contact structure 42 is formed on the portions of the n-type layer 16 that form the streets 40. The n-contact structure 42 may be formed by a patterned deposition process, such as metal plating through a mask with openings that are registered with the streets 40. As illustrated in FIG. 3B, at this fabrication step, the n-contact structure 42 forms an n-contact grid that surrounds each of the active LED structure mesas 12'. In this manner, the n-contact structure 42 is formed with a corresponding shape to the active LED structure mesas 12'. For example, when the active LED structure mesas 12' form a honeycomb structure, the n-contact structure 42 may form a corresponding honeycomb structure.

Figure 4A:
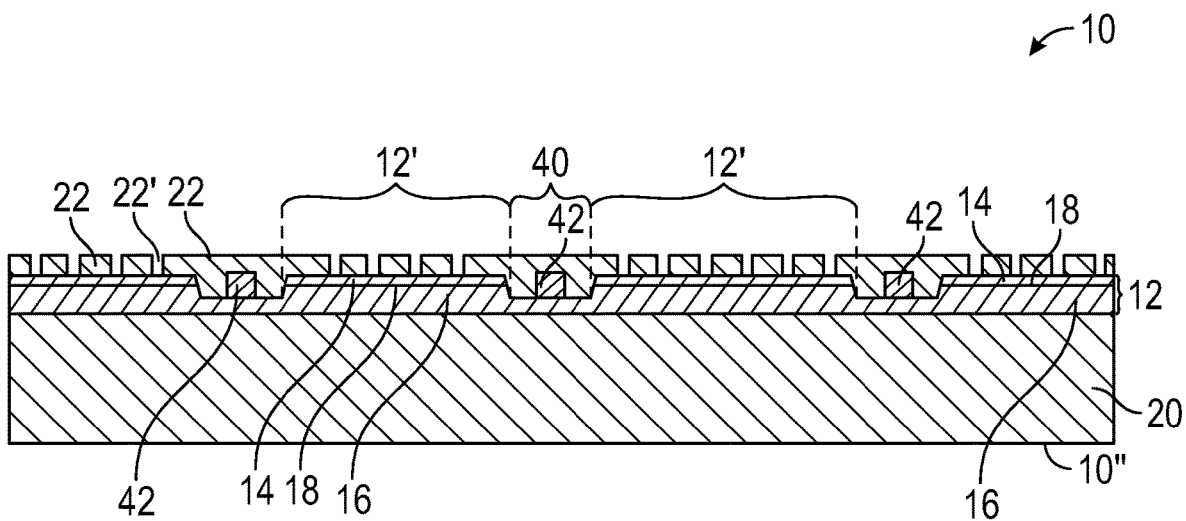
FIG. 4A illustrates a cross-sectional view of the LED chip of FIG. 3A at a subsequent fabrication step where a first reflective layer is formed.
Figure 4B:
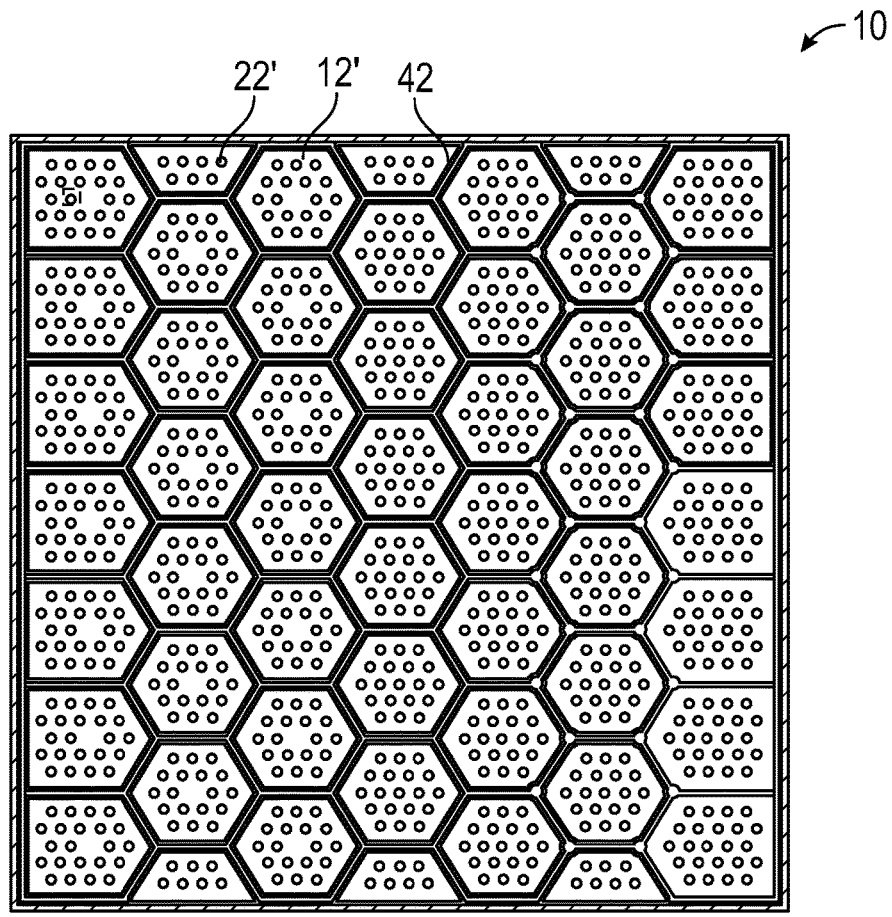
FIG. 4B illustrates a corresponding bottom view of the LED chip of FIG. 4A at the same fabrication step.

In FIG. 4A, the first reflective layer 22 is formed to cover the active LED structure 12 and the n-contact structure 42 on a side of the active LED structure 12 that is opposite the substrate 20. In this manner, the first reflective layer 22 may be formed to fill the streets 40 between the active LED structure mesas 12', thereby encapsulating the n-contact structure 42. As described above, the first reflective layer 22 may comprise one or more dielectric layers. In this manner, the first reflective layer 22 may provide electrical insulation for the n-contact structure 42 to avoid electrical shorting with other elements of the LED chip 10. A number of openings 22' may be formed in the first reflective layer 22 that are registered inside boundaries of the active LED structures mesas 12'. As such, the openings 22' may be formed such that various portions of the p-type layer 14 in each of the active LED structure mesas 12' are accessible through the first reflective layer 22. For illustrative purposes, the openings 22' are drawn rectangular. In practice, the openings 22' may form any number of shapes relative to the first reflective layer 22, such as openings 22' that are bounded by sloped sidewalls of the first reflective layer 22 due to etching. As best illustrated in FIG. 4B, the openings 22' may be formed in various patterns across each of the active LED structure mesas 12' to form contact areas for the reflective layer interconnects 26 of FIG. 5A to electrically connect with the p-type layer 14.

Figure 5A:
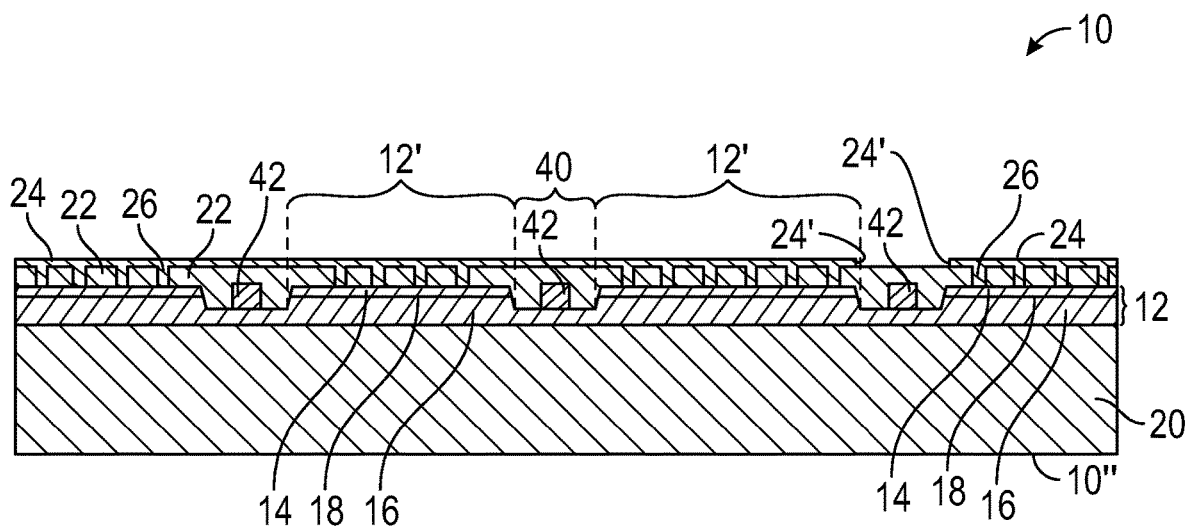
FIG. 5A illustrates a cross-sectional view of the LED chip of FIG. 4A at a subsequent fabrication step where a second reflective layer and reflective layer interconnects are formed.
Figure 5B:
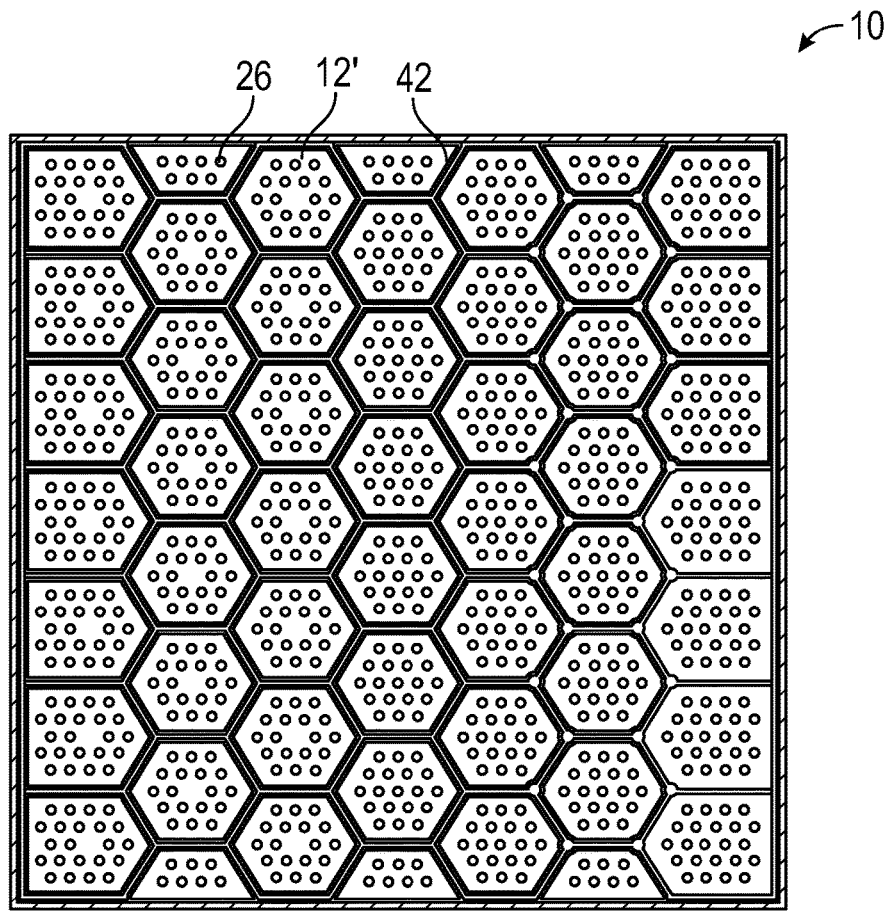
FIG. 5B illustrates a corresponding bottom view of the LED chip of FIG. 5B at the same fabrication step.

In FIG. 5A, the second reflective layer 24 is formed to cover the first reflective layer 22 and also fill the openings 22' that are illustrated in FIG. 4A. In this manner, the portion of the second reflective layer 24 that fills the openings 22' forms the reflective layer interconnects 26. In other embodiments, the second reflective layer 24 and the reflective layer interconnects 26 may be formed by a two-step process where the reflective layer interconnects 26 are first formed, followed by the second reflective layer 24. The second reflective layer 24 may be formed by any number of metal deposition techniques. In certain embodiments, the second reflective layer 24 is formed by a patterned deposition step such that portions of first reflective layer 22 that are registered with certain portions of the n-contact structure 42 are not covered by the second reflective layer 24. In this regard, peripheral edges 24' of the second reflective layer 24 may define openings in the second reflective layer 24 that correspond with regions where the n-contact interconnect 38 of FIG. 8A will be formed to contact the n-contact structure 42. As illustrated in FIG. 5B, the reflective layer interconnects 26 are formed in the openings 22' of FIG. 4B to provide arrays of electrical contact points to each active LED structure mesa 12', and more particularly to the p-type layer 14 of each active LED structure mesa 12'. The pattern and/or diameters of the reflective layer interconnects 26 on each active LED structure mesa 12' may be varied to improve current spreading.

Figure 6A:
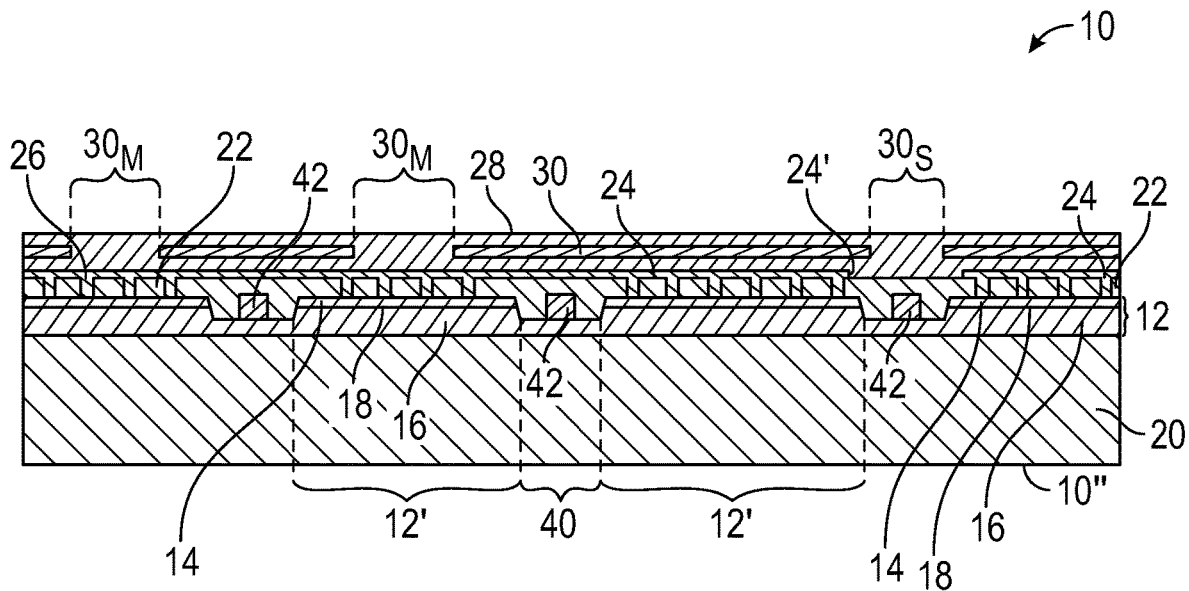
FIG. 6A illustrates a cross-sectional view of the LED chip of FIG. 5A at a subsequent fabrication step where a passivation layer and an interlayer are formed.
Figure 6B:
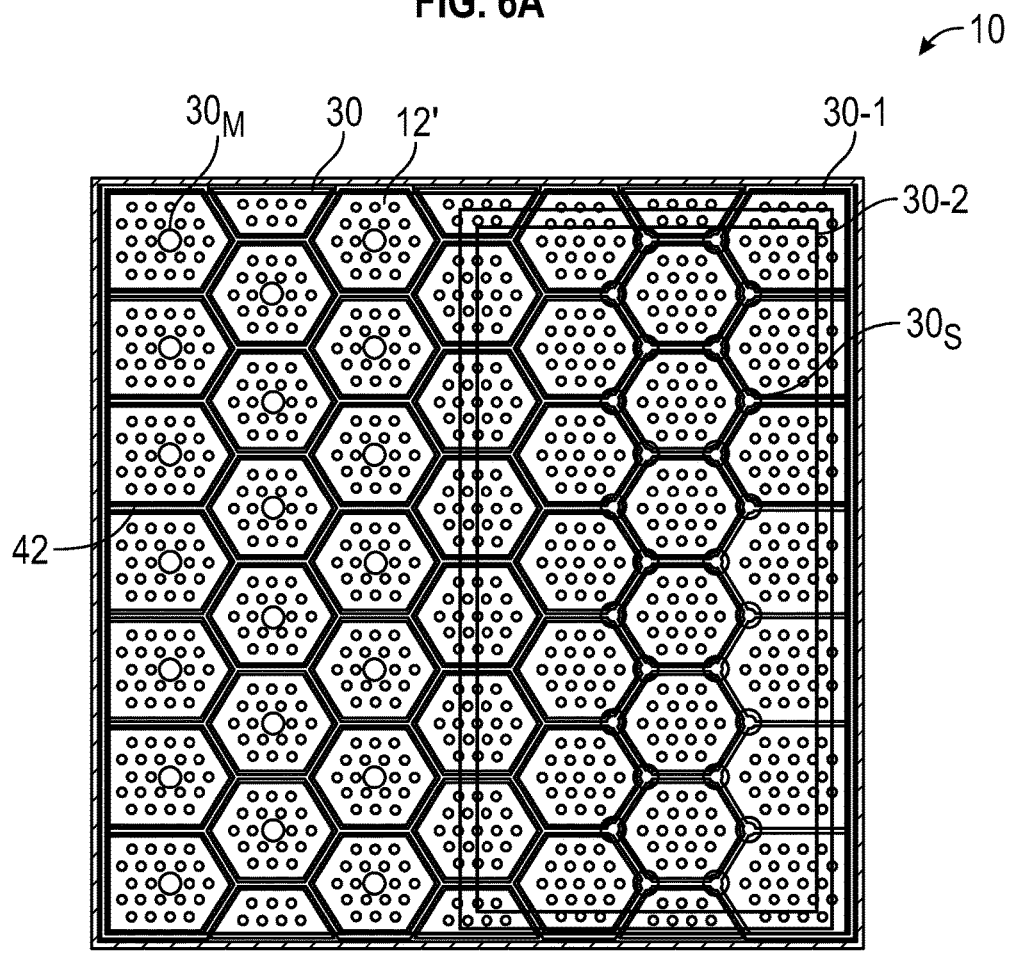
FIG. 6B illustrates a corresponding bottom view of the LED chip of FIG. 6A at the same fabrication step.

In FIG. 6A, the passivation layer 28 and the interlayer 30 are formed on the second reflective layer 24 and the first reflective layer 22. The interlayer 30, when present, is electrically isolated from other portions of the LED chip 10 by the passivation layer 28. In particular, the interlayer 30 may be fully embedded within the passivation layer 28. As illustrated, the interlayer 30 may be formed with a number of openings 30M, 30S that are registered with different areas of the active LED structure 12. The openings 30M are arranged to reside over portions of each of the active LED structure mesas 12' while the openings 30S are arranged to reside over certain ones of the streets 40 that are proximate the peripheral edges 24' of the second reflective layer 24. As best illustrated in FIG. 6B, the openings 30M of the interlayer 30 are centrally located on certain ones of the active LED structure mesas 12' while the openings 30S of the interlayer 30 are registered with certain vertices of the n-contact structure 42. As further illustrated in FIG. 6B, superimposed lines are provided that illustrated overall locations of the interlayer 30. A first portion 30-1 of the interlayer 30 may extend along a perimeter of the LED chip 10 and across portions of the LED chip 10 up to the openings 30M. A second portion 30-2 of the interlayer 30 is arranged across portions of the LED chip 10 up to the openings 30S and a gap may be formed between the first and second portions 30-1, 30-2. In certain embodiments, the first portion 30-1 may laterally surround an entire perimeter of the second portion 30-2. The first and second portions 30-1, 30-2 may respectively correspond with locations of the anode contact and the cathode contact of the LED chip 10.

Figure 7A:
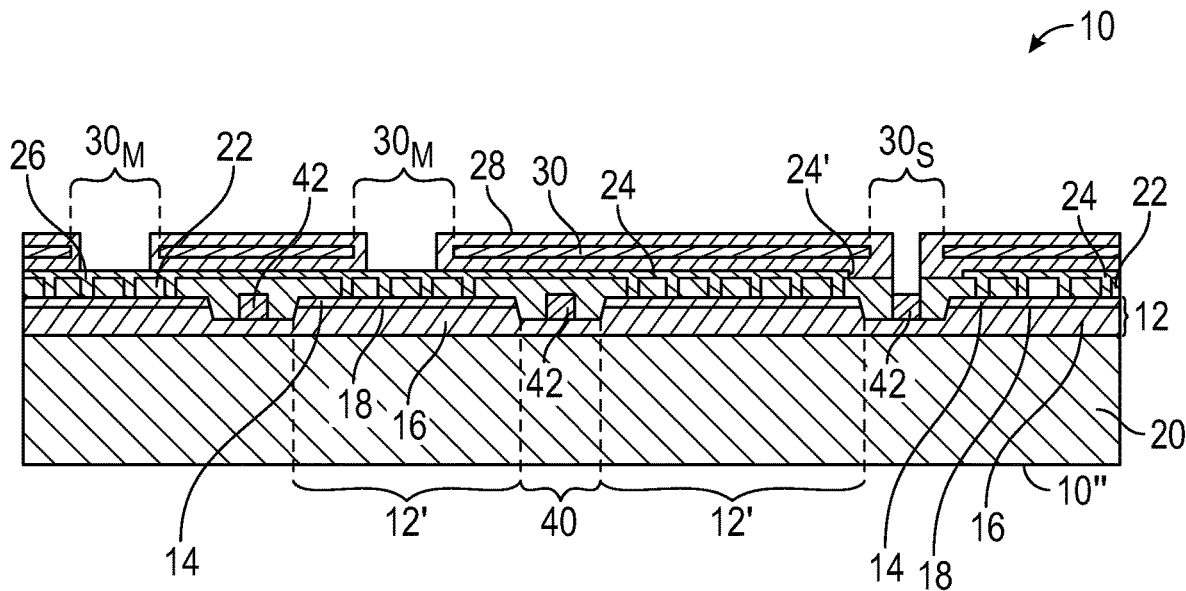
FIG. 7A illustrates a cross-sectional view of the LED chip of FIG. 6A at a subsequent fabrication step where portions of the passivation layer are removed to expose underlying portions of the LED chip.
Figure 7B:
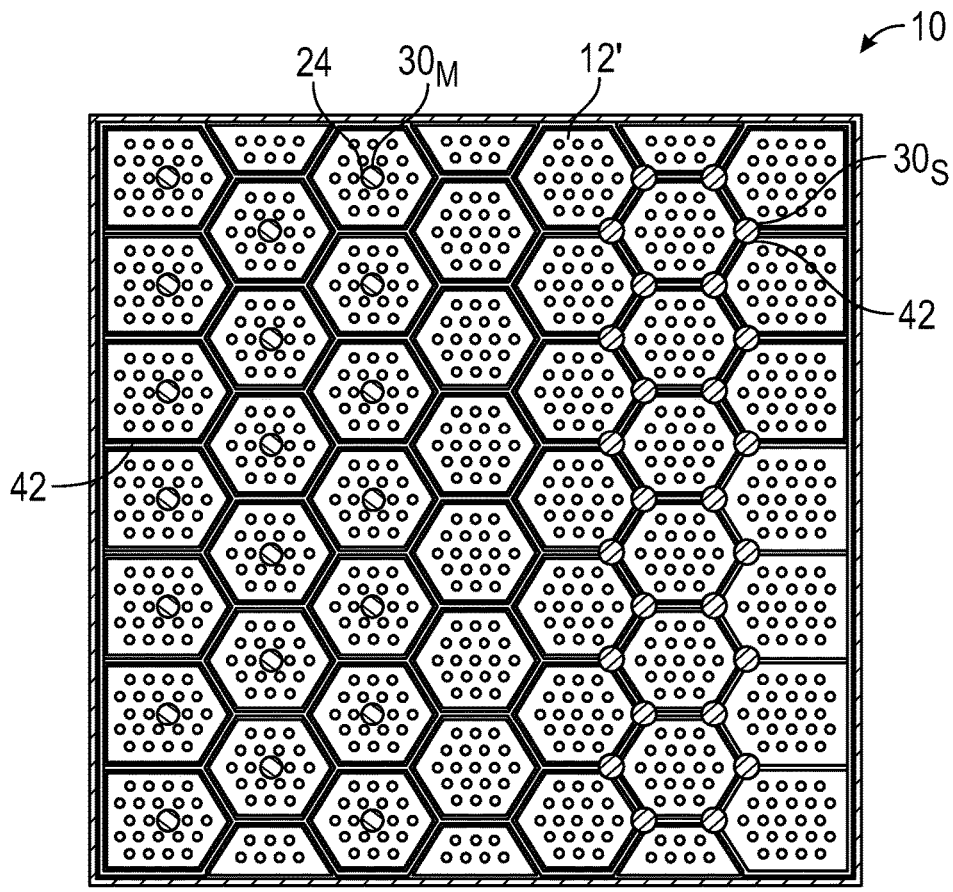
FIG. 7B illustrates a corresponding bottom view of the LED chip of FIG. 7A at the same fabrication step.

In FIG. 7A, portions of the passivation layer 28 that are registered with the openings 30M, 30S of the interlayer 30 are removed to expose underlying portions of the LED chip 10. In this manner, the passivation layer 28 may be subjected to a selective removal process, such as etching through a patterned mask to arrive at the LED chip 10 of FIG. 7A. As illustrated, the portions of the passivation layer 28 that are removed within the openings 30M provide access to surfaces of the second reflective layer 24 while the portions of the passivation layer 28 that are removed within the openings 30S provide access to surfaces of the n-contact structure 42. In the bottom view of FIG. 7B, the exposed portions of the second reflective layer 24 are provided centrally on certain active LED structure mesas 12' while the exposed portions of the n-contact structure 42 are provided at vertices thereof.

Figure 8A:
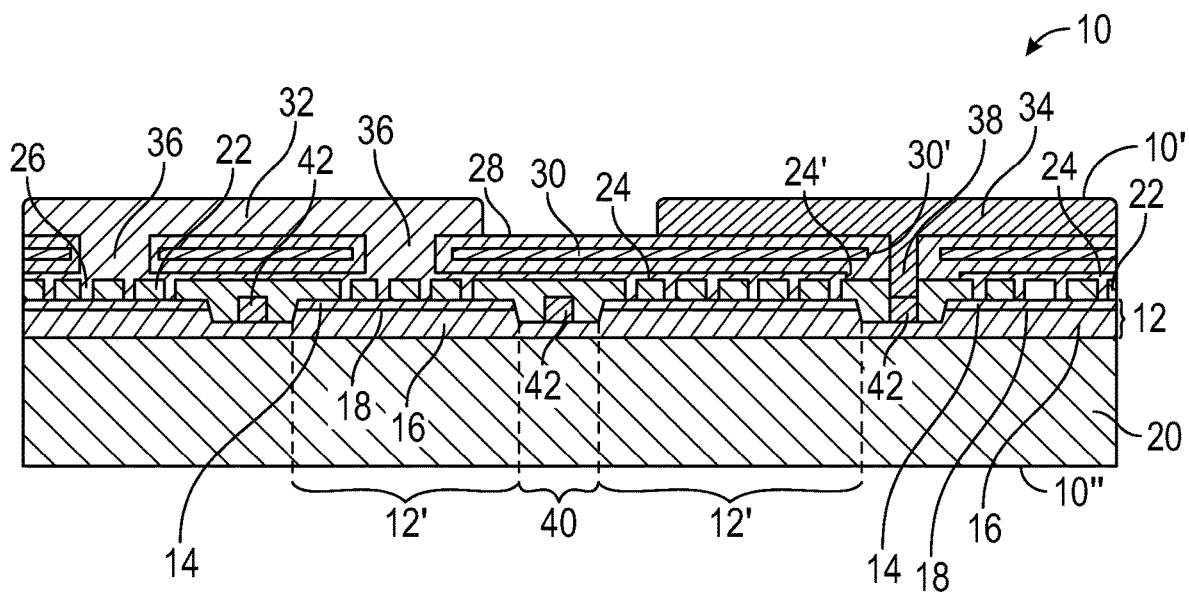
FIG. 8A illustrates a cross-sectional view of the LED chip of FIG. 7A at a subsequent fabrication step where an n-contact and a p-contact are formed to provide the LED chip of FIG. 1A.
Figure 8B:
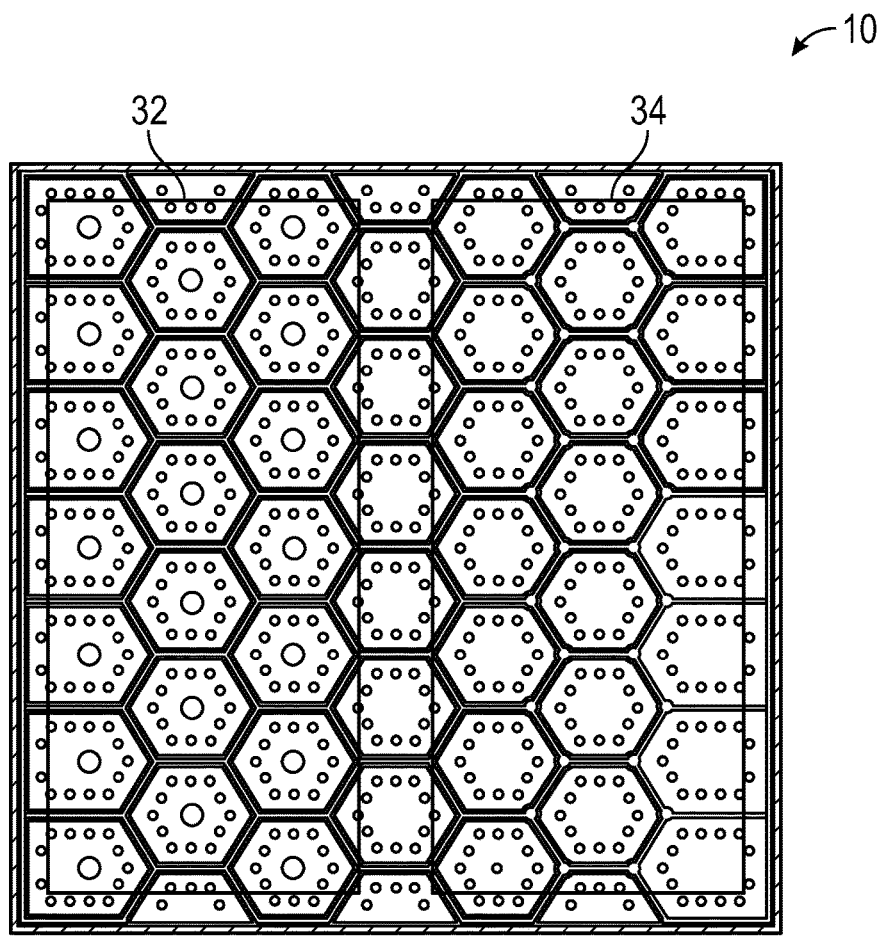
FIG. 8B illustrates a corresponding bottom view of the LED chip of FIG. 8A.

In FIG. 8A, the p-contact 32 and the n-contact 34 are arranged on the passivation layer 28 to form bond pads or contacts that are arranged to provide electrical connections respectively to the p-type layer 14 and the n-type layer 16. The p-contact interconnects 36 are formed to fill the portions of the passivation layer 28 that are removed through the openings (30M of FIG. 7A) of the interlayer 30. In this manner, the p-contact interconnects 36 electrically connect the p-contact 32 to the p-type layer 14 by way of the second reflective layer 24 and the reflective layer interconnects 26. The n-contact interconnects 38 are formed to fill the portions of the passivation layer 28 that are removed through the openings (30S of FIG. 7A) of the interlayer 30. In this manner, the n-contact interconnects 38 electrically connect the n-contact 34 to the n-type layer 16 by way of the n-contact structure 42. As illustrated in FIG. 8B, the p-contact 32 and the n-contact 34 may be arranged adjacent one another on the bottom of the LED chip 10 to facilitate flip-chip mounting. In this manner, the LED chip 10 as illustrated in FIG. 8B may be inverted for mounting to an underlying support element with an orientation as shown in FIG. 1A.

Figure 9A:
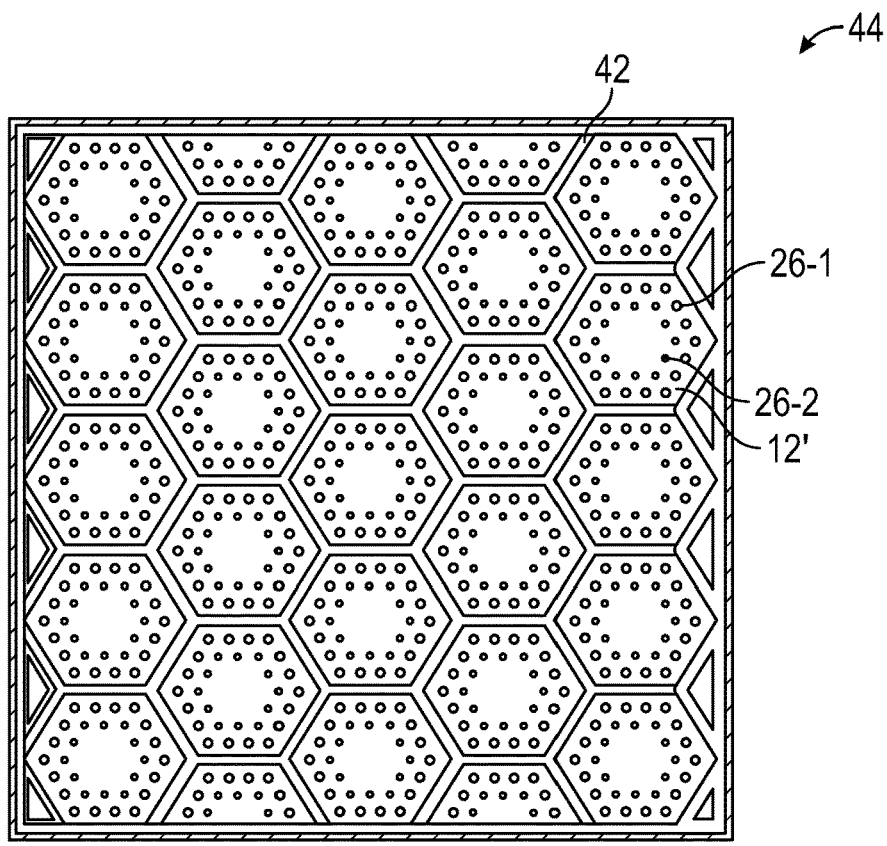
FIG. 9A is a bottom view of an LED chip at a fabrication sequence similar to FIG. 5A with an alternative arrangement of reflective layer interconnects.
Figure 9B:
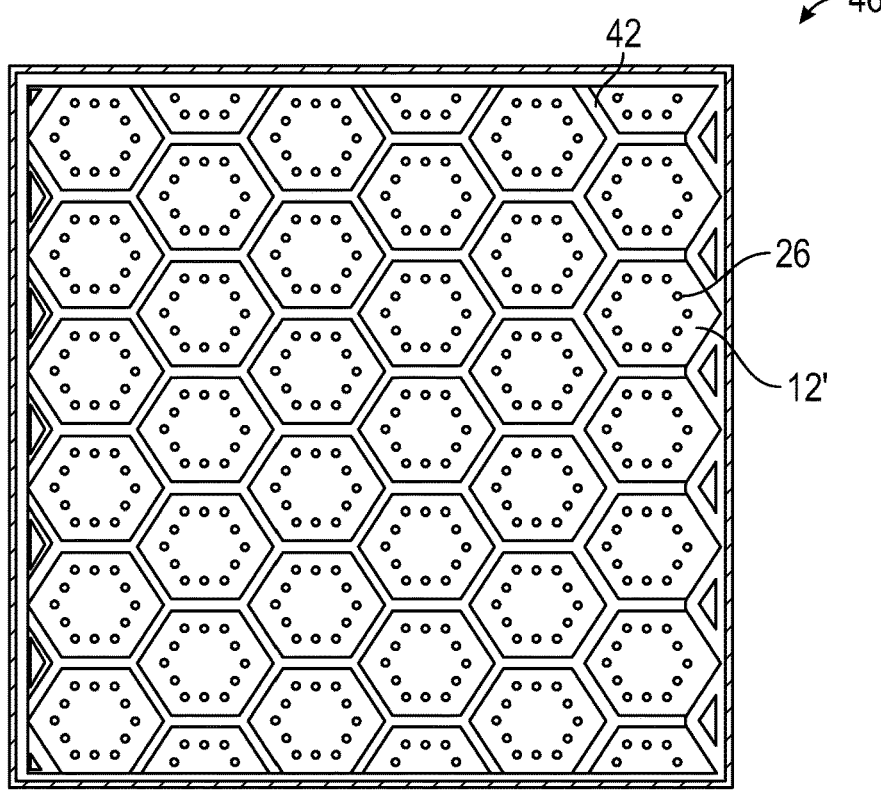
FIG. 9B is a bottom view of an LED chip at a fabrication sequence similar to FIG. 5A with another alternative arrangement of reflective layer interconnects.

As described above, the reflective layer interconnects 26 may be formed with different shapes and patterns along each active LED structure mesa 12' to further control how current is spread relative to the p-type layer 14. In this regard, FIGS. 9A and 9B illustrate two examples of alternative patterns that may be implemented for the reflective layer interconnects 26. FIG. 9A is a bottom view of an LED chip 44 at a fabrication sequence similar to FIG. 5A with an alternative arrangement of reflective layer interconnects 26-1, 26-2 (also referred to collectively as reflective layer interconnects 26). As illustrated, reflective layer interconnects 26-1, 26-2 may be formed with different diameters along portions of a same one of the active LED structure mesas 12'. For example, the reflective layer interconnects 26-1 that are arranged closer to a perimeter of each active LED structure mesas 12' may have larger diameters than reflective layer interconnects 26-2 that are arranged closer to a center of each active LED structure mesas 12'. In this manner, the larger diameter reflective layer interconnects 26-1 may provide increased current handling along perimeter portions of each active LED structure mesa 12' where current spreading may otherwise be less efficient than central portions. The term diameter may refer to diameters of circular shaped reflective layer interconnects 26-1, 26-2. FIG. 9B is a bottom view of an LED chip 46 at a fabrication sequence similar to FIG. 5A with another alternative arrangement of the reflective layer interconnects 26. In FIG. 9B, the reflective layer interconnects 26 are formed in a single row along the active LED structure mesa 12' with uniform diameters.

The views provided in FIGS. 9A and 9B correspond with the fabrication step illustrated in FIGS. 5A and 5B for the LED chip 10. In this manner, the fabrication sequence provided in FIGS. 2A to 8B may be equally applicable to the LED chips 44 and 46 of FIGS. 9A and 9B. As further illustrated in FIGS. 5A, 9A, and 9B, the reflective layer interconnects 26 may form outlines of shapes that correspond with the active LED structure mesas 12' and the n-contact structure 42, such as hexagon-shaped arrangements of reflective layer interconnects 26 that correspond with hexagon-shaped active LED structure mesas 12' and the n-contact structure 42.

While the above-described embodiments are provided in the context of LED chip arrangements for flip-chip mounting, the principles disclosed are applicable to other LED chip geometries. For example, one or more of the n-contact and the p-contact could be arranged to be accessible from light-emitting faces of LED chips, rather than having both n- and p-contacts arranged on mounting faces of LED chips. In this manner, the n-contact and the p-contact may be arranged to be accessible from opposing faces of LED chips.

Figure 10:
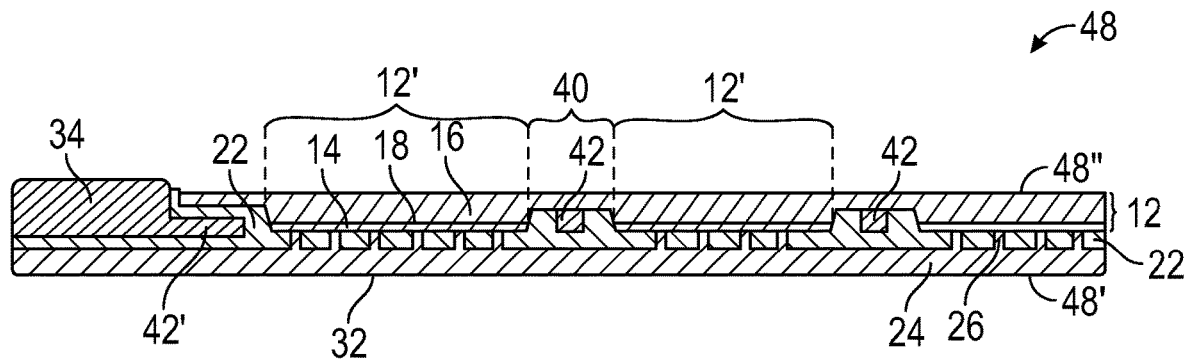
FIG. 10 is a generalized cross-sectional view of an LED chip that is similar to the LED chip of FIG. 1A but for arrangements where the n-contact is accessible from a light-emitting face of the LED chip.

FIG. 10 is a generalized cross-sectional view of an LED chip 48 that is similar to the LED chip 10 of FIG. 1A but for embodiments where the n-contact 34 is accessible from a light-emitting face 48" of the LED chip 48. The LED chip 48 may have a similar arrangement of the active LED structure mesas 12', the streets 40, the n-contact structure 42, the first reflective layer 22, the second reflective layer 24, and the reflective layer interconnects 26 as described for FIG. 1A. In FIG. 10, the n-contact 34 is arranged to be accessible from the light-emitting face 48" that is opposite a mounting face 48' of the LED chip 48. In this manner, the n-contact structure 42 may form a grid that is embedded within the first reflective layer 22 and the n-contact structure 42 may further include a portion 42' that is electrically coupled to the n-contact 34. To avoid electrical shorting, portions of the first reflective layer 22 may be arranged between the aforementioned portion 42' of the n-contact structure 42 and the active LED structure 12. By arranging the n-contact 34 to be accessible from the light-emitting face 48", external electrical connections to the n-contact 34 may be provided by a wire bond. As further illustrated in FIG. 10, such an arrangement also allows the p-contact 32 to extend across larger portions of the mounting face 48'. In certain embodiments, the metal of the second reflective layer 24 may be provided with suitable thickness to also form the p-contact 32. In other embodiments, the p-contact 32 may be formed by another metal layer that is arranged on a bottom side of the second reflective layer 24. In certain embodiments, the p-contact 32 may be arranged to cover an entire area of the mounting face 48' or an area in a range from 90% to 100% of the mounting face 48'.

Figure 11:
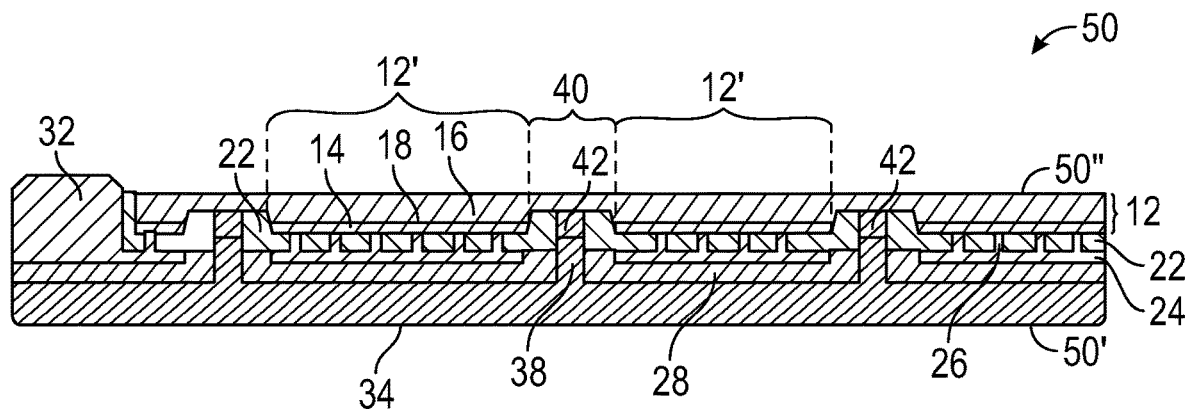
FIG. 11 is a generalized cross-sectional view of an LED chip that is similar to the LED chip of FIG. 1A but for embodiments where the p-contact is accessible from a light-emitting face of the LED chip.

FIG. 11 is a generalized cross-sectional view of an LED chip 50 that is similar to the LED chip 10 of FIG. 1A but for embodiments where the p-contact 32 is accessible from a light-emitting face 50" of the LED chip 50. The LED chip 50 may have a similar arrangement of the active LED structure mesas 12', the streets 40, the n-contact structure 42, the first reflective layer 22, the second reflective layer 24, the reflective layer interconnects 26, and the passivation layer 28 as described for FIG. 1A. In FIG. 11, the n-contact 34 is arranged to be accessible from a mounting face 50' of the LED chip 50 that is opposite light-emitting face 50". The n-contact 34 may be electrically coupled to the n-contact structure 42 by way of the one or more n-contact interconnects 38. As with other embodiments, the n-contact structure 42 may form a grid that is embedded within the first reflective layer 22. In certain embodiments, the n-contact 34 may be arranged to cover an entire area of the mounting face 50' or an area in a range from 90% to 100% of the mounting face 50'. The p-contact 32 is arranged to be accessible from the light-emitting face 50" and portions of the first reflective layer 22 may be arranged between the p-contact 32 and certain portion of the active LED structure 12 to prevent electrical shorting. As illustrated, the p-contact 32 may be electrically coupled to the p-type layer 14 by way of the second reflective layer 24 and the reflective layer interconnects 26. While the second reflective layer 24 appears discontinuous in the cross-sectional view of FIG. 11, it is appreciated that the n-contact interconnects 38 are formed through openings of continuous portions of the second reflective layer 24.

Figure 12:
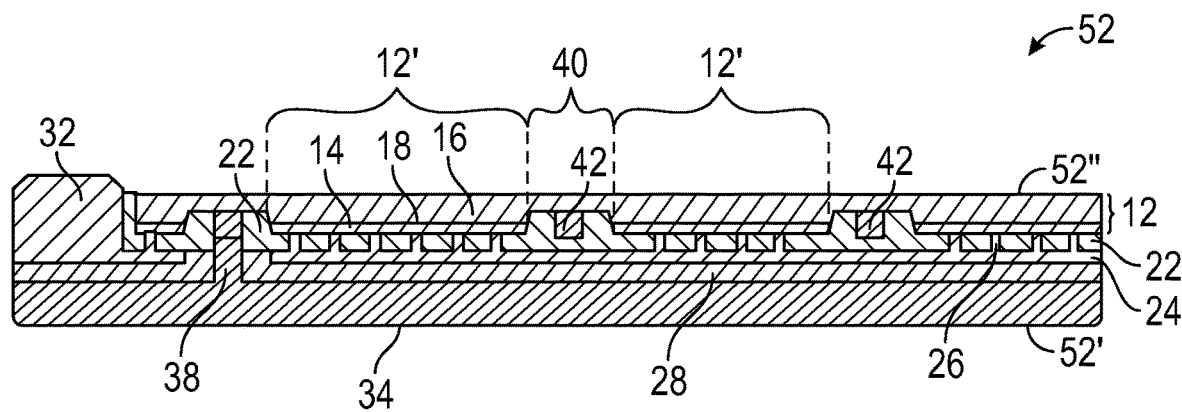
FIG. 12 is a generalized cross-sectional view of an LED chip that is similar to the LED chip of FIG. 11 but where the n-contact interconnects are not registered with all of the streets

FIG. 12 is a generalized cross-sectional view of an LED chip 52 that is similar to the LED chip 50 of FIG. 11 but where the n-contact interconnects 38 are not registered with all of the streets 40. In FIG. 12, only one n-contact interconnect 38 is illustrated that electrically couples the n-contact 34 to the n-contact structure 42. Since the n-contact structure 42 forms an interconnected grid that is embedded within the LED chip 52 in a similar manner as previously described embodiments, only one n-contact interconnect 38 may be sufficient, particularly for smaller sizes of the LED chip 52. In this manner, the reflective structure formed by the first reflective layer 22 and the second reflective layer 24 may cover more area within the LED chip 52.

While the above-described embodiments are provided in the context of contact arrangements where the active LED structure mesas are electrically coupled in parallel between the n-contact and the p-contact, the principles disclosed are applicable to other LED chip structures. For example, LED chips may include multiple ones of the n-contacts or p-contacts as part of arrangements that allow individual control of one or more active LED structure mesas independently of other active LED structure mesas. Such arrangements may be advantageous for applications where LED chip emissions may be dynamically controlled. In this regard, individual active LED structure mesas or groups thereof may form individual pixels within an LED chip.

Figure 13:
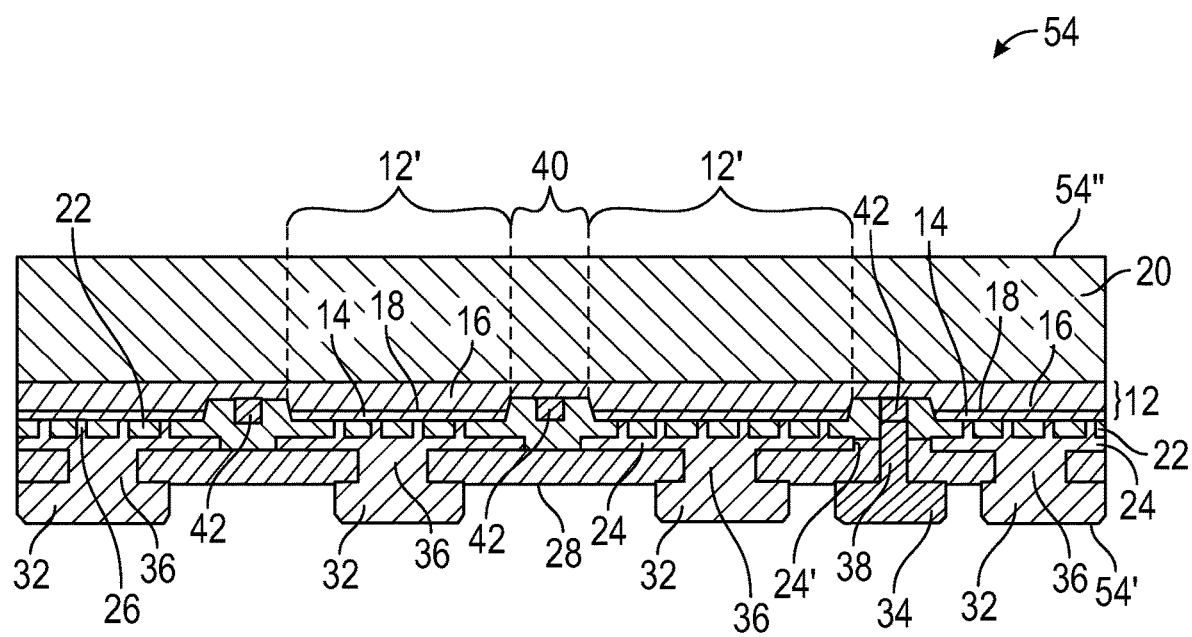
FIG. 13 is a generalized cross-sectional view of an LED chip that is similar to the LED chip of FIG. 1A but for embodiments where one or more of the active LED structure mesas are independently controllable.

FIG. 13 is a generalized cross-sectional view of an LED chip 54 that is similar to the LED chip 10 of FIG. 1A but for embodiments where one or more of the active LED structure mesas 12' are independently controllable. In certain embodiments, multiple p-contacts 32 are provided that are electrically coupled in a separate manner to various ones of the active LED structure mesas 12'. In this manner, the second reflective layer 24 may be provided in a discontinuous manner across the LED chip 54. By way of example, four p-contacts 32 are illustrated that are electrically connected to four different active LED structure mesas 12' in a separate manner. A single n-contact 34 is provided that is electrically coupled to the n-contact structure 42. As described above, the n-contact structure 42 forms an interconnected grid that is electrically coupled to the n-type layer 16. Since the n-type layer 16 is common to each of the active LED structure mesas 12', the n-contact 34 provides a common control line for the active LED structure mesas 12' while separate control lines are formed by each of the p-contacts 32. In this manner, different ones of the active LED structure mesas 12' may be electrically activated and deactivated in an independent manner.

Figure 14A:
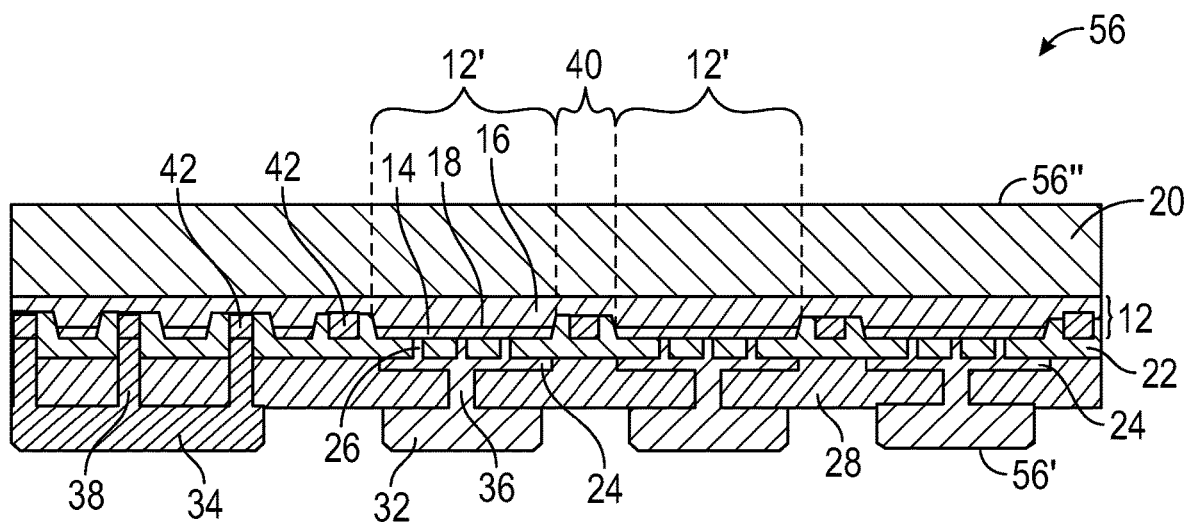
FIG. 14A is a generalized cross-sectional view of an LED chip that is similar to the LED chip of FIG. 13 and includes an alternative arrangement of the n-contact.
Figure 14B:
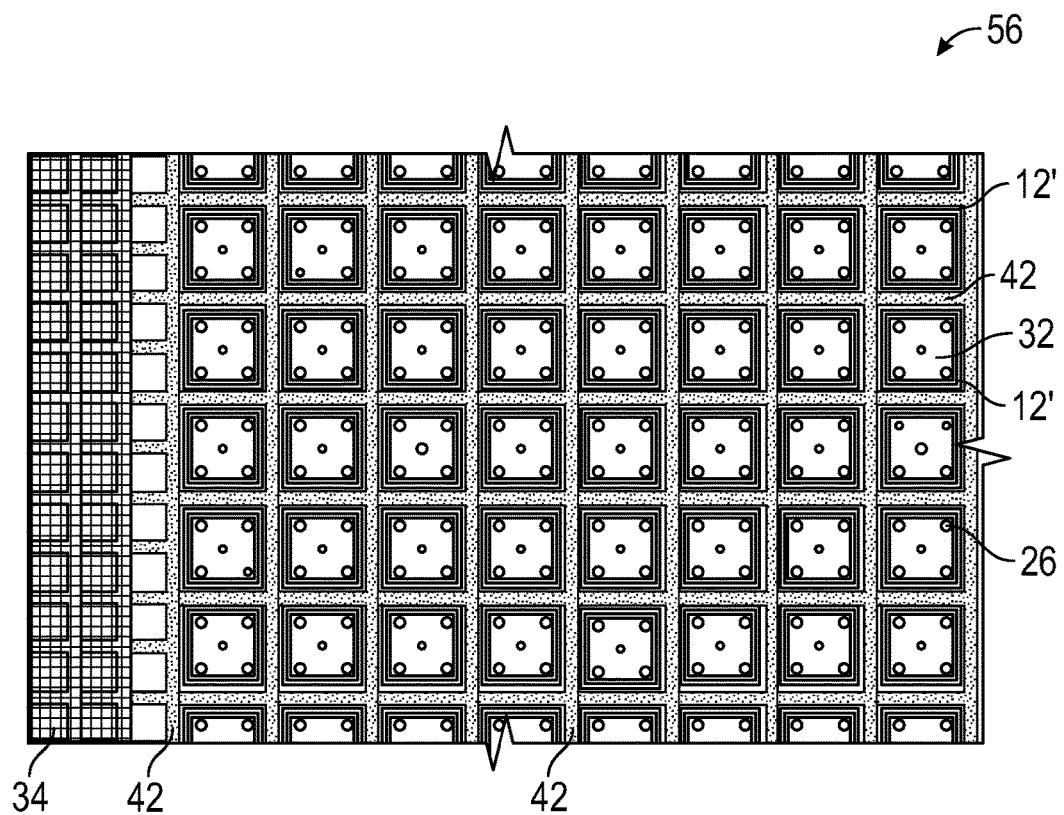
FIG. 14B is a corresponding bottom view of a portion of the LED chip of FIG. 14A.

FIG. 14A is a generalized cross-sectional view of an LED chip 56 that is similar to the LED chip 54 of FIG. 13 and includes an alternative arrangement of the n-contact 34. In FIG. 14A, the n-contact 34 is arranged at an edge of the LED chip 56 and several n-contact interconnects 38 electrically couple the n-contact 34 to the n-contact structure 42 along the edge of the LED chip 56. The n-contact structure thereby provides electrical connections to portions of the n-type layer 16 that are outside an area of the LED chip 56 where the n-contact 34 is positioned. A plurality of the p-contacts 32 are electrically coupled to different active LED structure mesas 12' as described for FIG. 13. In this manner, different ones of the active LED structure mesas 12' may be electrically activated and deactivated in an independent manner. FIG. 14B is a corresponding bottom view of a portion of the LED chip 56 of FIG. 14A. As illustrated, the n-contact 34 may form an n-contact bar that is elongated along one edge of the LED chip 56. The n-contact bar may be a non-emitting portion of the LED chip 56. The plurality of p-contacts 32 are registered with individual ones of the active LED structure mesas 12' to provide independent control. As best illustrated in FIG. 14B, the reflective layer interconnects 26 may be arranged in a pattern across each active LED structure mesa 12' to evenly distribute electrical connections to the p-type layer 14. Additional patterns for the reflective layer interconnects 26, such as those described for FIGS. 9A and 9B, may also be implemented.

Figure 15:
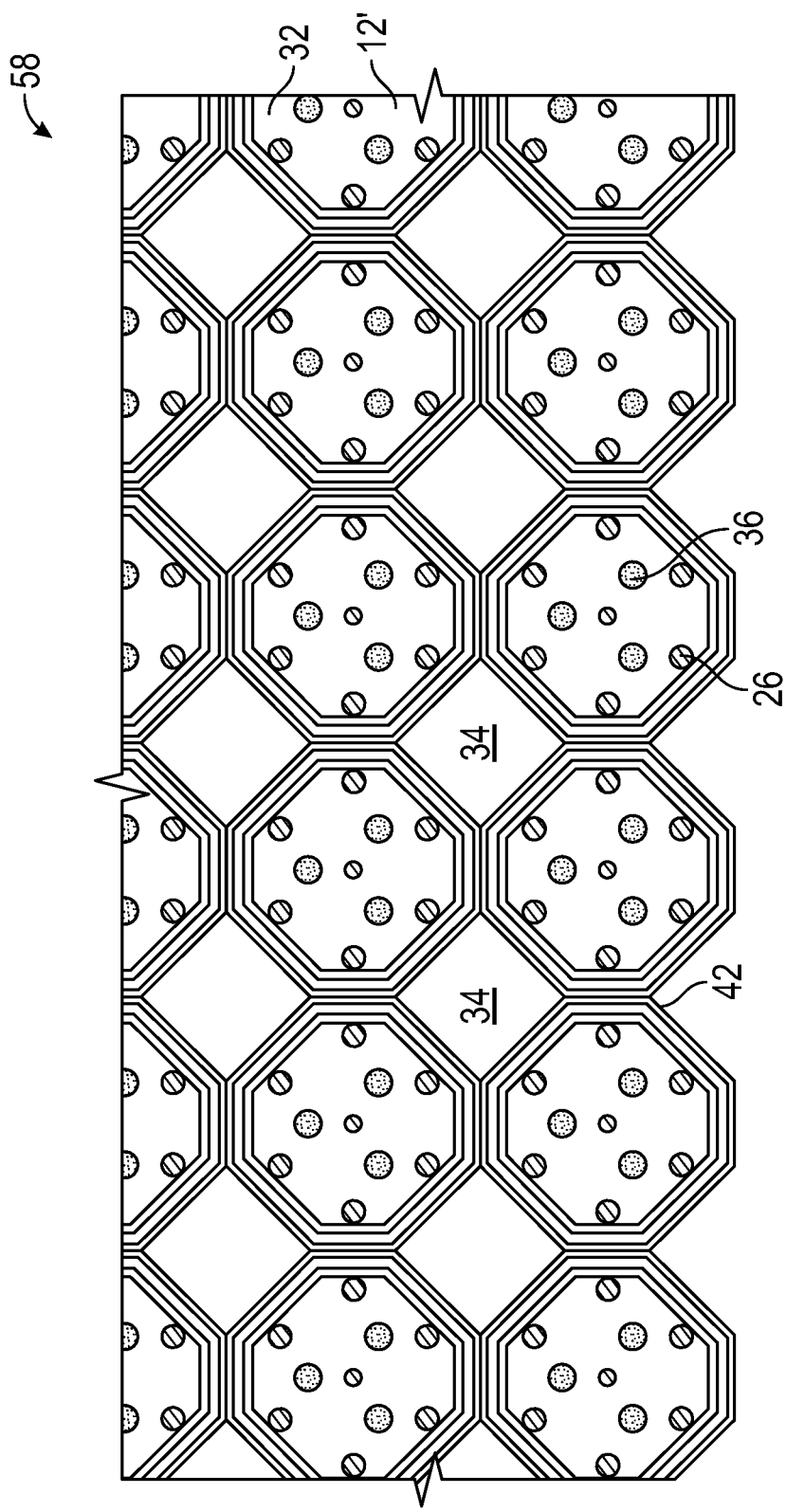
FIG. 15 is a bottom view of an LED chip that is similar to the LED chip of FIGS. 14A and 14B but includes a different pattern of the active LED structure mesas.

FIG. 15 is a bottom view of an LED chip 58 that is similar to the LED chip 56 of FIGS. 14A and 14B but includes a different pattern of the active LED structure mesas 12'. Rather than the square-shaped grid as best illustrated in FIG. 14B, the active LED structure mesas 12' of FIG. 15 form octagon shapes that are arranged such that larger areas of the n-contact structure 42 are formed between neighboring active LED structure mesas 12'. In this manner, such larger areas of the n-contact structure 42 may form various n-contacts 34 for the n-contact structure 42. Since the n-contact structure 42 is interconnected, increased flexibility is provided as current may effectively spread through the LED chip 58 even if not all of the n-contacts 34 are directly connected to external power. The p-contacts 32 are separately arranged on each of the active LED structure mesas 12' as described for FIGS. 14A and 14B to provide individual addressability. The presence of the larger areas of the n-contact structure 42 that are arranged between neighboring active LED structure mesas 12' may also serve to increase contrast between the active LED structure mesas 12'. While more of the LED chip 58 may be occupied by the n-contact structure 42 and the corresponding streets, an elongated and non-emitting n-contact bar as illustrated in FIG. 14B may not be required, thereby gaining back some light-emitting area of the LED chip 58.

Figure 16A:
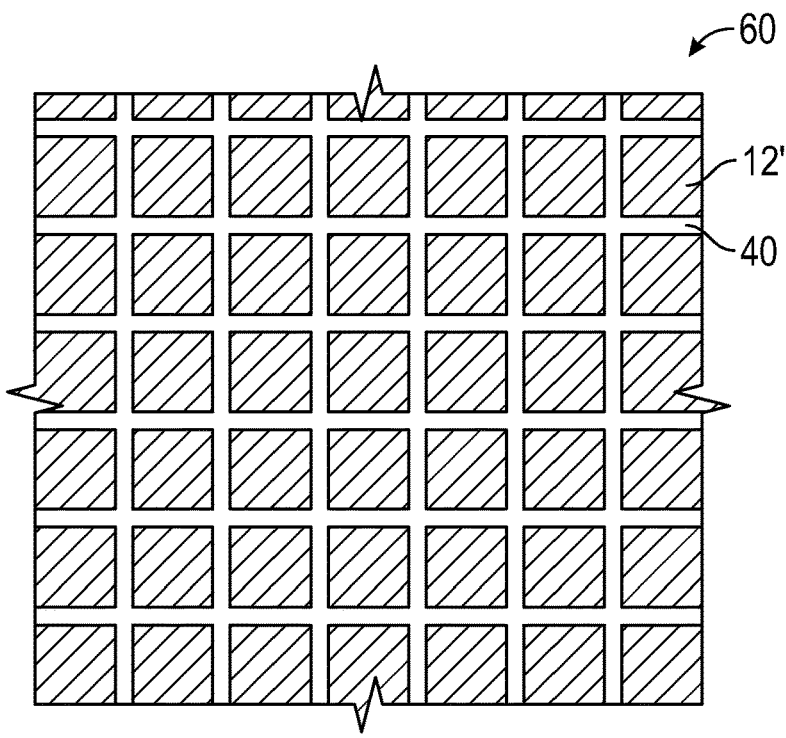
FIG. 16A illustrates a bottom view of an LED chip that is similar to the LED chip of FIG. 1A at an initial fabrication step where active LED structure mesas and corresponding streets are formed.

FIGS. 16A to 21B illustrate various stages of fabrication for an LED chip 60 that is similar to the LED chip 10 of FIGS. 1A and 1B but for embodiments where the streets 40 are arranged to extend entirely through the active LED structure 12. Each fabrication step for the LED chip 60 is illustrated with a bottom view of the LED chip 60 in a manner similar to FIG. 1B and a corresponding cross-sectional view of the LED chip 60 in a manner similar to FIG. 1A. For example, FIG. 16A illustrates a bottom view of the LED chip 60 at an initial fabrication step and FIG. 16B illustrates a corresponding cross-sectional view of the LED chip 60 at the same fabrication step as FIG. 16A. In the exemplary fabrication sequence of FIGS. 16A to 21B, square-shaped active LED structure mesas 12' are provided in a grid arrangement. However, the exemplary fabrication sequence of FIGS. 16A to 21B could equally be followed to form other shapes for the active LED structure mesas 12', including hexagonal shapes, octagons, squares, rectangles, and circular shapes, among others.

Figure 16B:
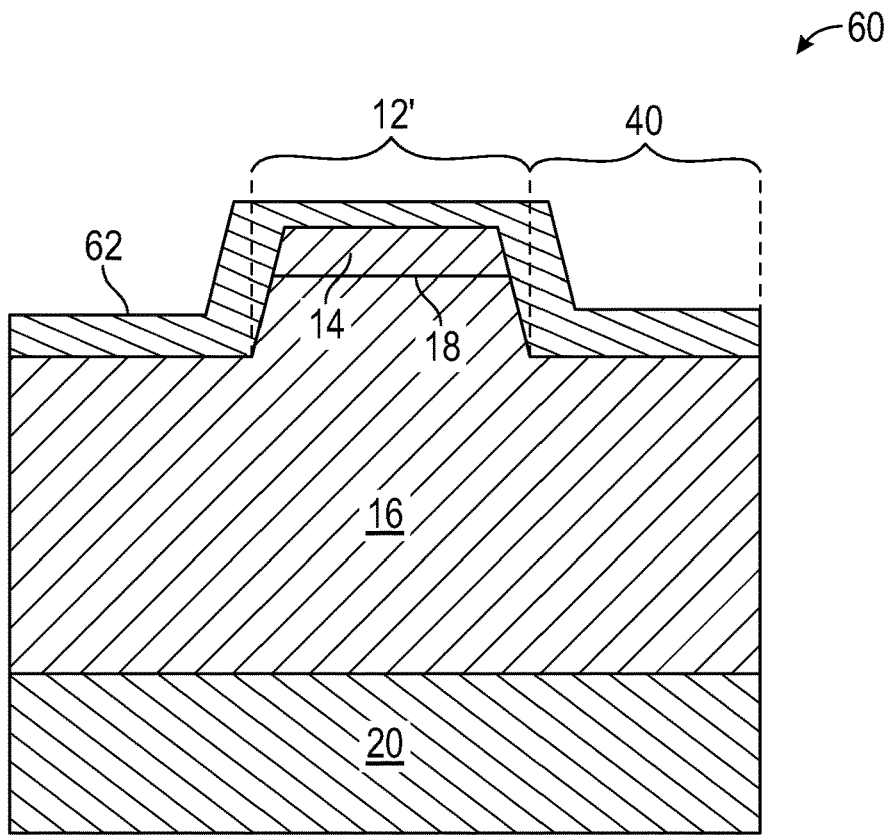
FIG. 16B illustrates a corresponding cross-sectional view of the LED chip of FIG. 16A at the same fabrication step.

FIG. 16A is a bottom view of the LED chip 60 illustrating a grid array of the active LED structure mesas 12' and corresponding streets 40 therebetween. FIG. 16B is a cross-sectional view of one of the active LED structure mesas 12' of FIG. 16A. As illustrated, a shallow portion of the active LED structure mesa 12' is initially formed through the p-type layer 14, the active layer 18 and a portion of the n-type layer 16, and the streets 40 are initially defined outside the active LED structure mesa 12'. A temporary passivation layer 62, such as silicon nitride or the like, is formed to cover the active LED structure mesa 12' and corresponding streets 40.

Figure 17A:
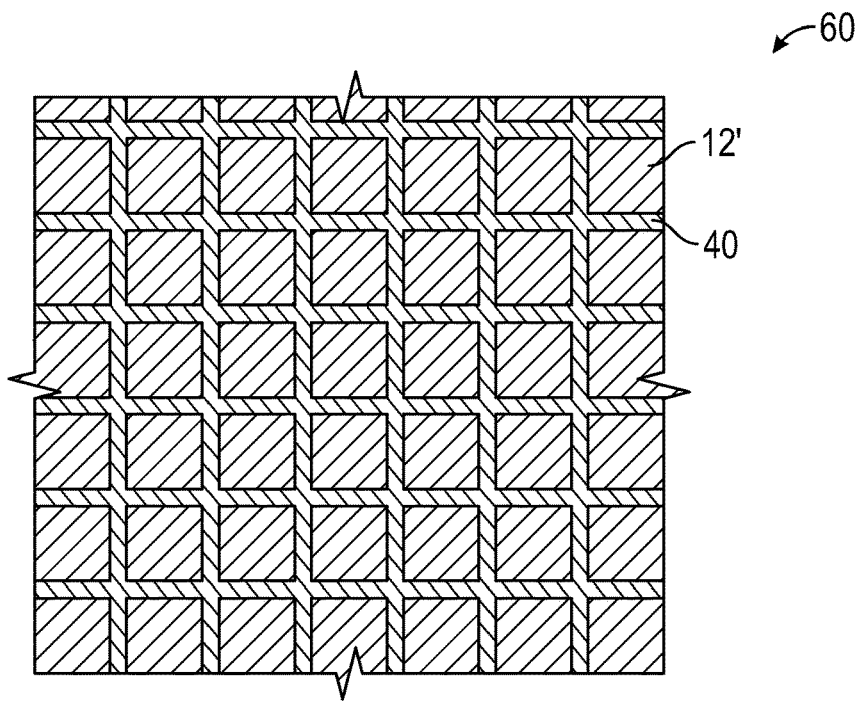
FIG. 17A illustrates a bottom view of the LED chip of FIG. 16A at a subsequent fabrication step where streets have been formed entirely through an n-type layer to expose portions of a substrate.
Figure 17B:
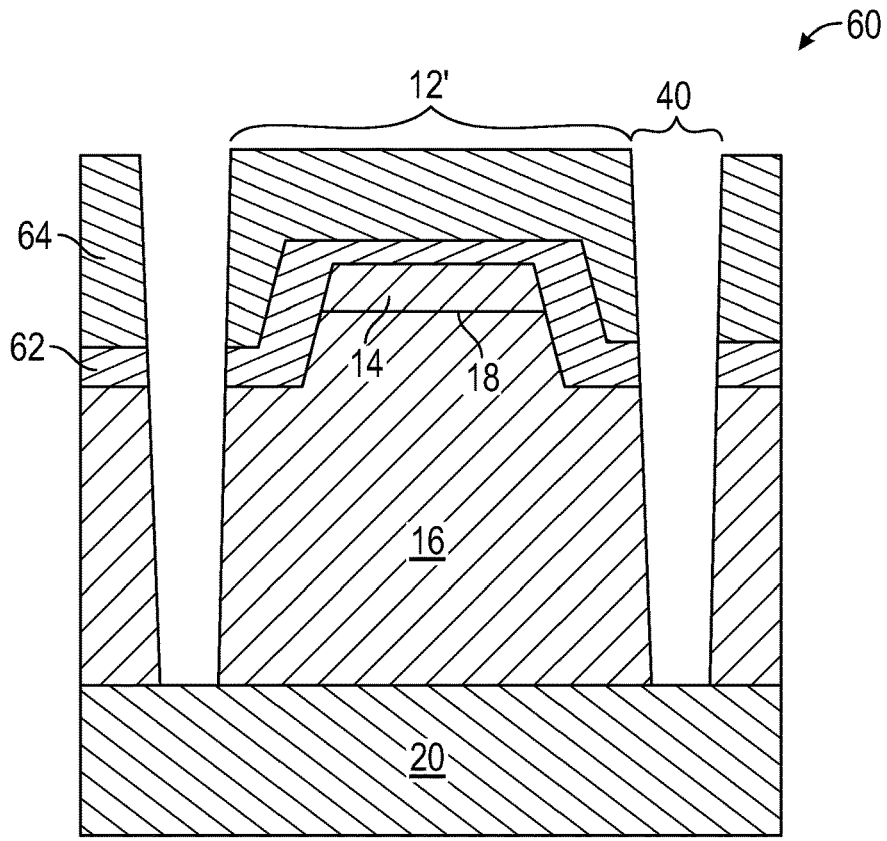
FIG. 17B illustrates a corresponding cross-sectional view of the LED chip of FIG. 17A at the same fabrication step.

FIGS. 17A and 17B illustrate the LED chip 60 at a subsequent fabrication step to FIGS. 16A and 16B where the streets 40 have been formed entirely through the n-type layer 16, thereby exposing portions of the substrate within the streets 40. In this manner, the active LED structure mesa 12' includes the shallow portion as first illustrated in FIG. 16B and a deeper portion that extends toward the substrate 20. A patterned photoresist layer 64 may formed on the temporary passivation layer 62, and a subtractive process, such as etching, may be performed through the patterned photoresist layer 64.

Figure 18A:
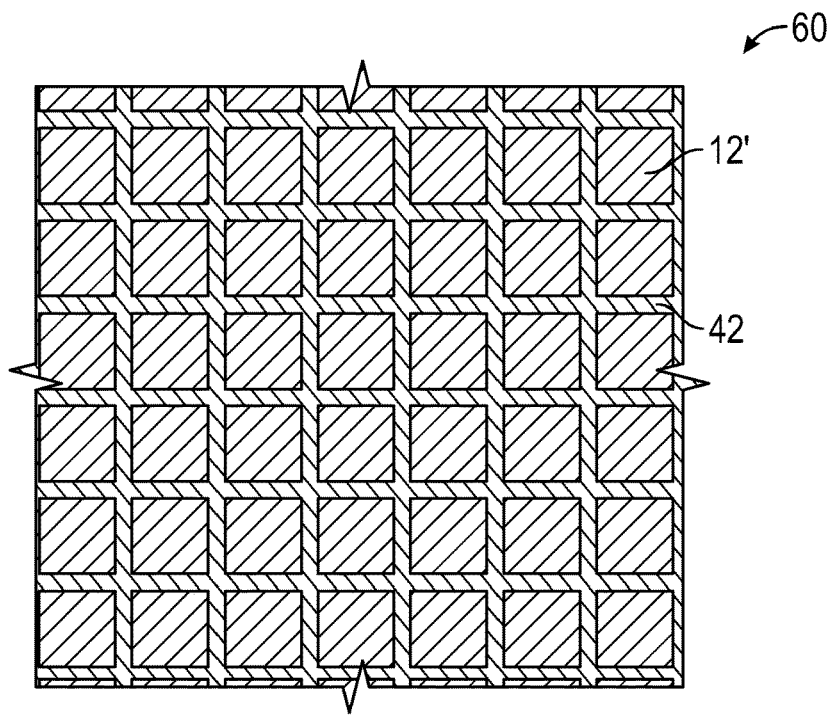
FIG. 18A illustrates a bottom view of the LED chip of FIG. 17A at a subsequent fabrication step where an n-contact structure is formed within the streets.
Figure 18B:
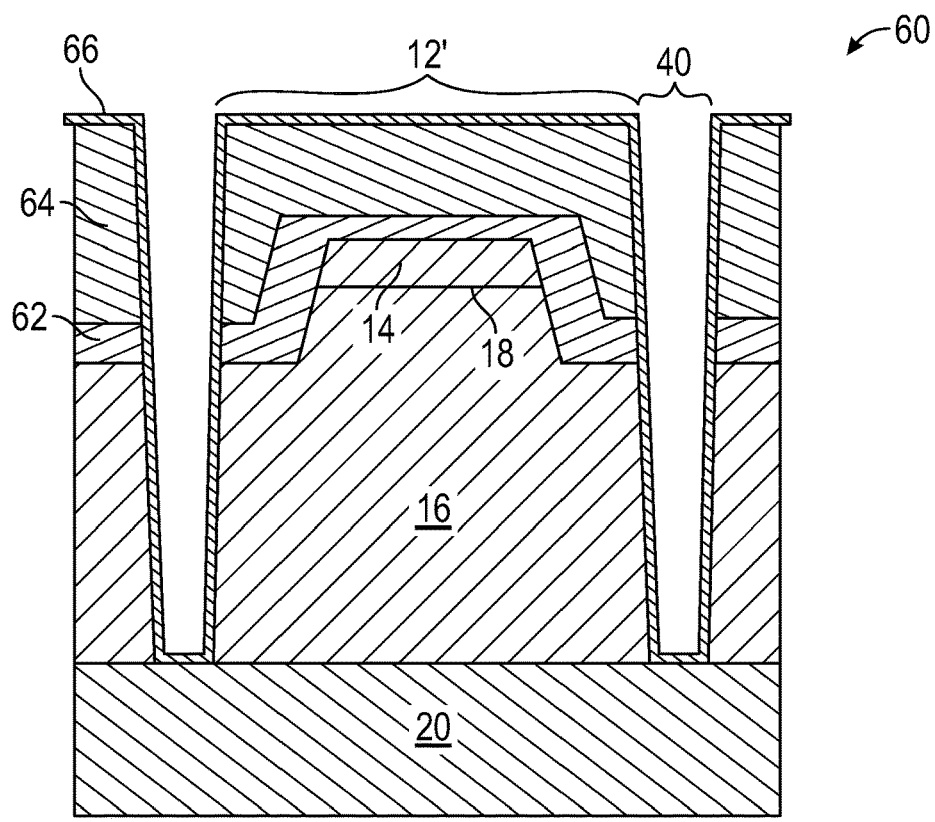
FIG. 18B illustrates a corresponding cross-sectional view of the LED chip of FIG. 18A at the corresponding fabrication step where a seed metal layer is formed in the streets.
Figure 18C:
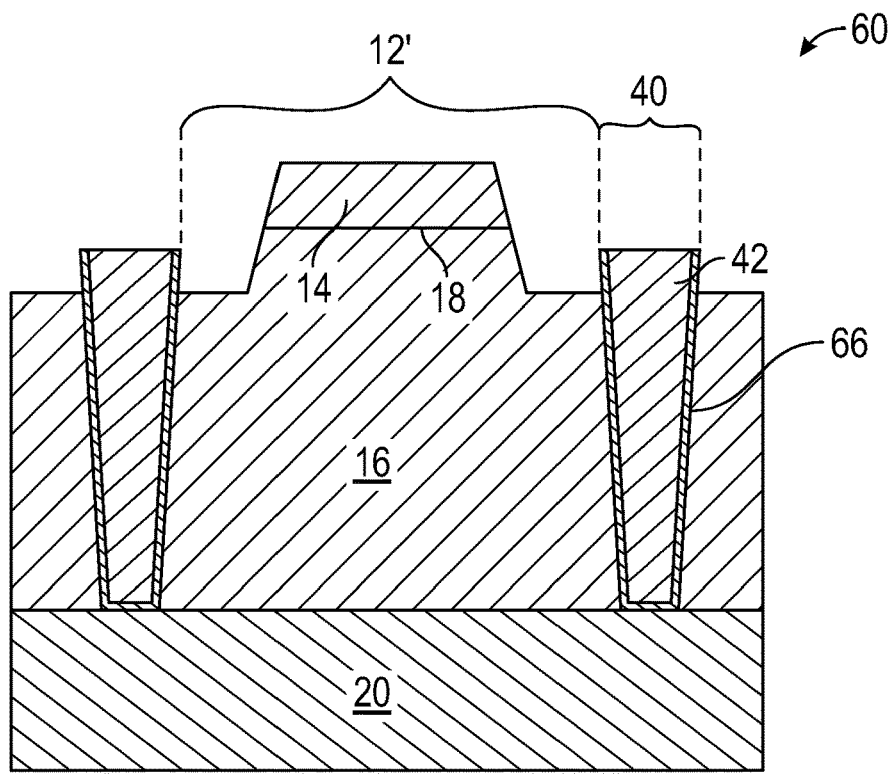
FIG. 18C illustrates a corresponding cross-sectional view of the LED chip of FIG. 18B at a subsequent fabrication step where a remainder of the n-contact structure is formed in the streets.

FIGS. 18A to 18C illustrate the LED chip 60 at subsequent fabrication steps to FIGS. 17A and 17B where the n-contact structure 42 is formed within the streets 40. In FIG. 18B, a thin seed metal layer 66 may be deposited on the LED chip 60 to cover the patterned photoresist layer 64 and conformally coat surfaces within the street 40, including sidewalls of the n-type layer 16 and previously exposed surfaces of the substrate 20. In FIG. 18C, the n-contact structure 42 is formed by plating metal on the seed metal layer 66 to fill the streets 40, followed by lift-off of the photoresist layer 64 and removal of the temporary passivation layer 62. In this manner, the seed metal layer 66 may form an initial portion of the n-contact structure 42 and the n-contact structure 42 may be in direct contact with sidewalls of the n-type layer 16. In further embodiments, the n-contact structure 42 may be in direct contact with surfaces of the substrate 20 that are registered with the streets 40.

Figure 19A:
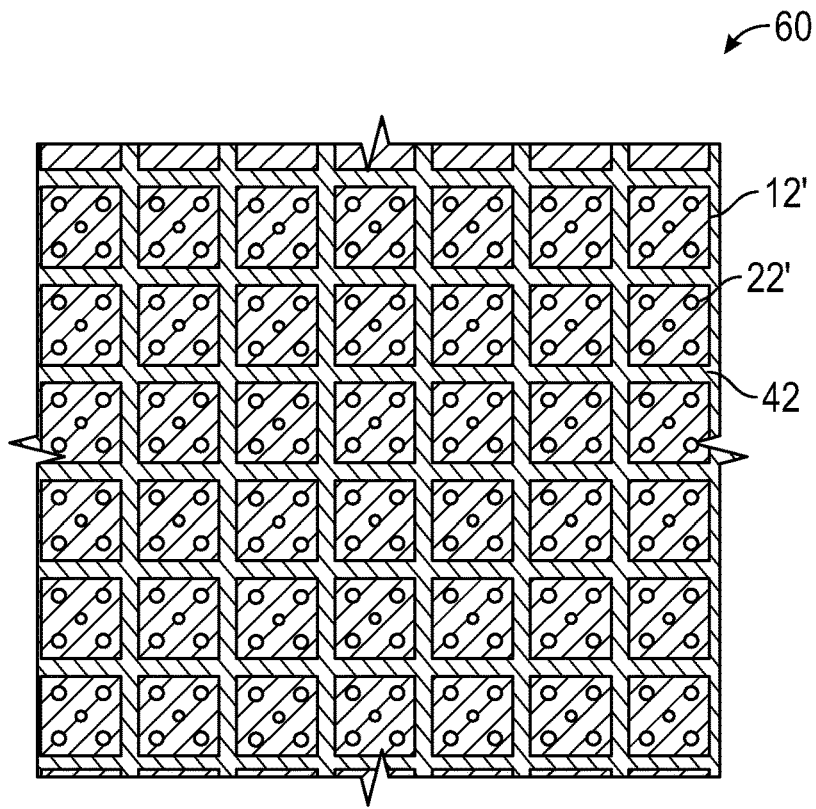
FIG. 19A illustrates a bottom view of the LED chip of FIG. 18A at a subsequent fabrication step where a first reflective layer and openings thereof are formed.
Figure 19B:
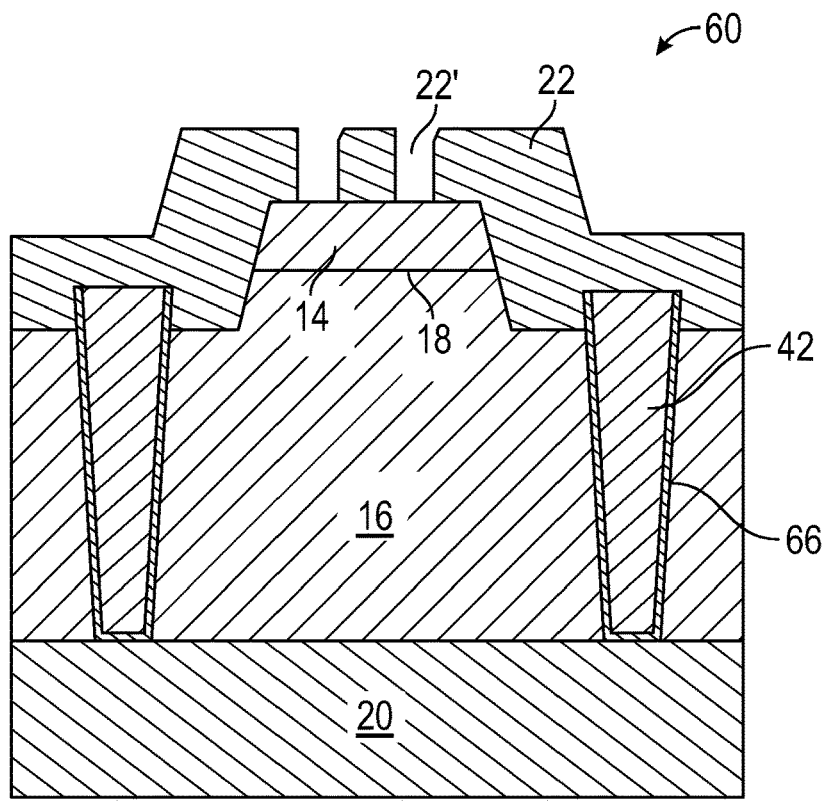
FIG. 19B illustrates a corresponding cross-sectional view of the LED chip of FIG. 19A at the same fabrication step.

FIGS. 19A and 19B illustrate the LED chip 60 at a subsequent fabrication step to FIGS. 18A to 18C where the first reflective layer 22 and the openings 22' thereof are formed. As previously described embodiments, the openings 22' provide access points to the p-type layer 14 for the subsequently formed reflective layer interconnects 26 and second reflective layer 24 as described below for FIGS. 20A and 20B. In FIG. 19A, the openings 22' may be arranged in a pattern across each active LED structure mesa 12' to provide openings to the p-type layer 14. Additional patterns, such as those described for FIGS. 9A and 9B, may also be implemented.

Figure 20A:
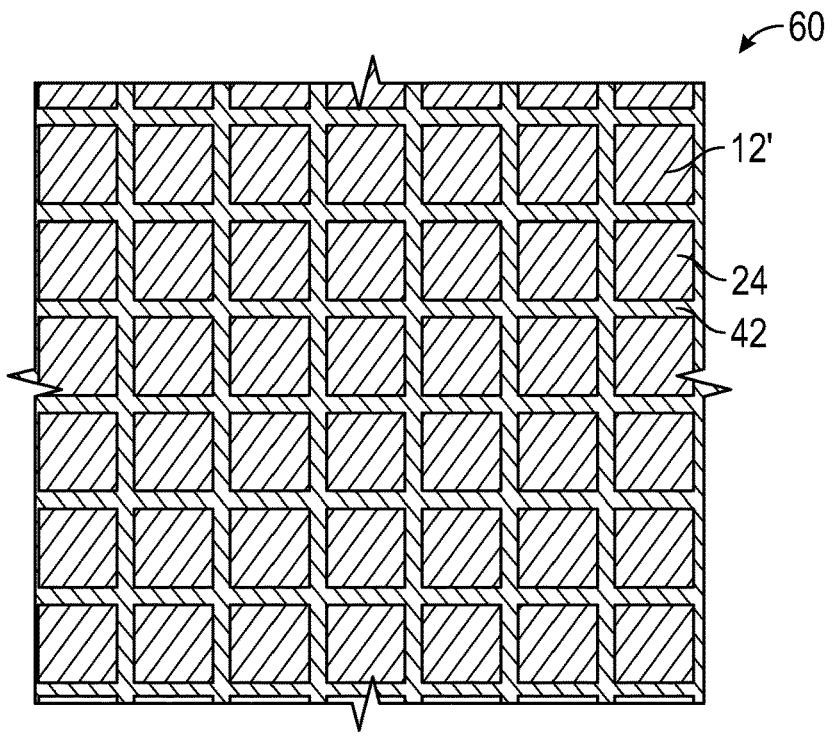
FIG. 20A illustrates a bottom view of the LED chip of FIG. 19A at a subsequent fabrication step where a second reflective layer and reflective layer interconnects are formed.
Figure 20B:
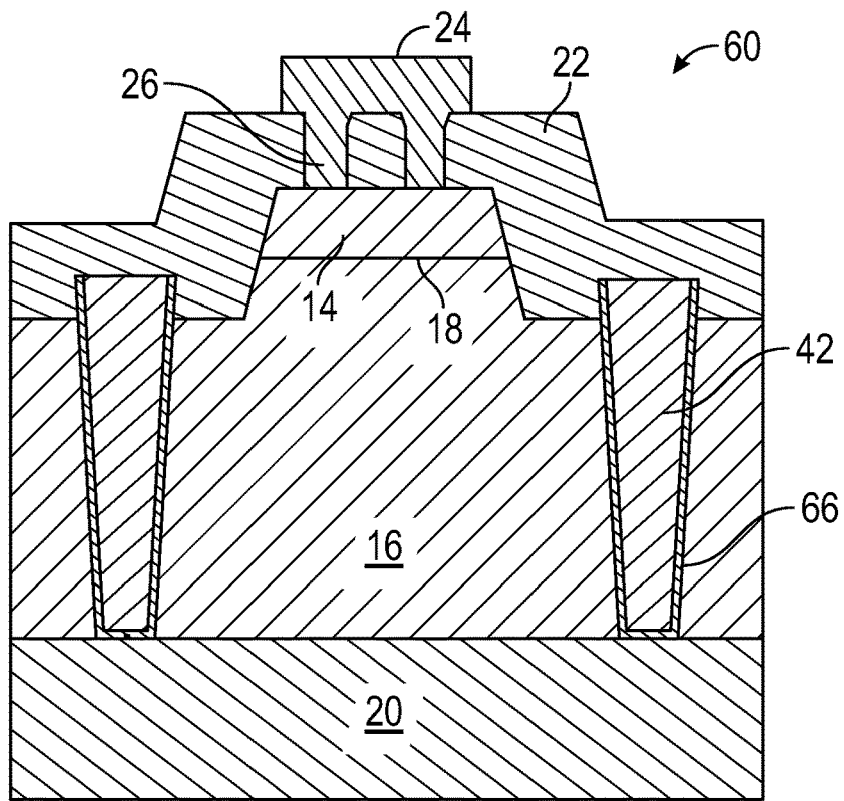
FIG. 20B illustrates a corresponding cross-sectional view of the LED chip of FIG. 20A at the same fabrication step.

FIGS. 20A and 20B illustrate the LED chip 60 at a subsequent fabrication step to FIGS. 19A and 19B where the reflective layer interconnects 26 and the second reflective layer 24 are formed. As best illustrated in FIG. 20B, the reflective layer interconnects 26 fill the openings 22' of FIG. 19B to form an electrically conductive path between the second reflective layer 24 and the p-type layer 14. From the bottom view of FIG. 20A, the second reflective layer 24 is formed in a discontinuous manner such that individual portions of the second reflective layer 24 are arranged on each of the active LED structure mesas 12'. Notably, the reflective structure is formed by the first reflective layer 22, the second reflective layer 24, and the one or more reflective layer interconnects 26, and the first reflective layer 22 is arranged to laterally extend across the n-contact structure 42 such that the first reflective layer 22 laterally extends between adjacent ones of the active LED structure mesas 12'.

Figure 21A:
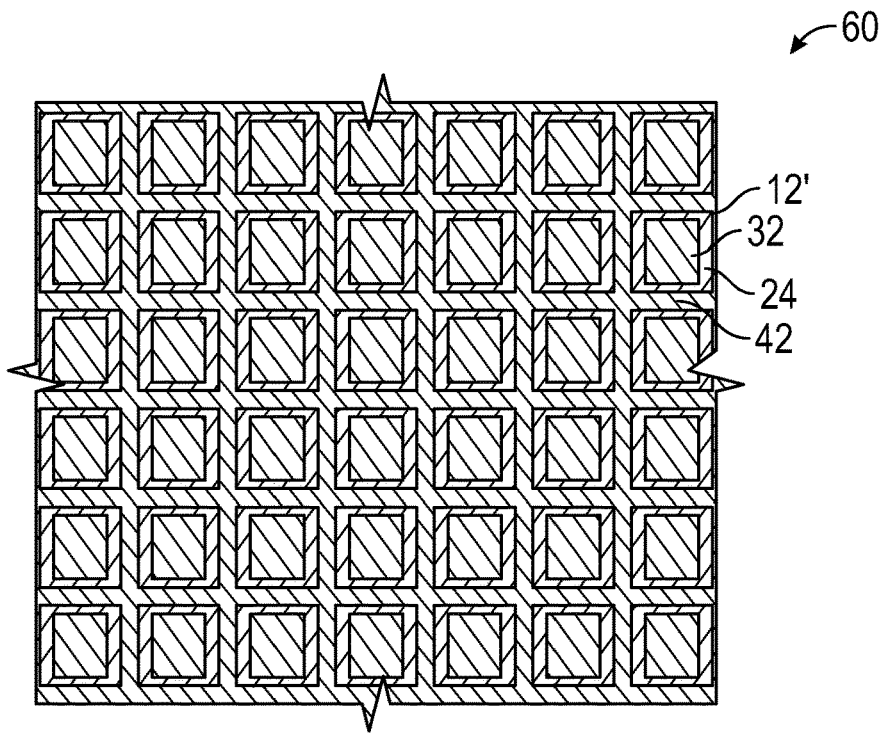
FIG. 21A illustrates a bottom view of the LED chip of FIG. 20A at a subsequent fabrication step where p-contacts are formed on each active LED structure mesa.
Figure 21B:
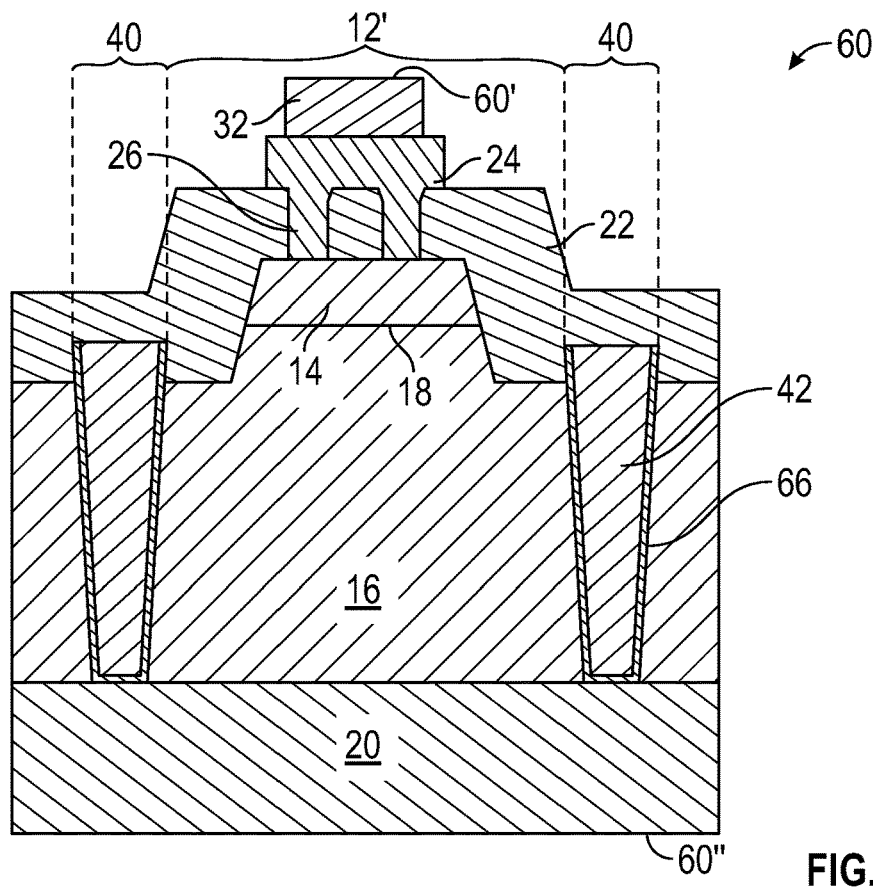
FIG. 21B illustrates a corresponding cross-sectional view of the LED chip of FIG. 21A at the same fabrication step

FIGS. 21A and 21B illustrate the LED chip 60 at a subsequent fabrication step to FIGS. 20A and 20B where individual p-contacts 32 are formed on each of the active LED structure mesas 12'. In this regard, each active LED structure mesas 12' may be addressable by the common n-contact structure 42 and the individual ones of the p-contacts 32. Accordingly, the active LED structure mesas 12' are configured to be individually addressable with respect to one another. The common n-contact structure 42 is therefore provided within the streets 40 and when the n-contact structure 42 extends entirely to the substrate 20, the n-contact structure 42 thereby electrically connects with sidewalls of the n-type layer 16. Additionally, the n-contact structure 42 in such an arrangement may provide increased contrast between neighboring active LED structure mesas 12' by forming a barrier for laterally propagating light between active LED structure mesas 12'. In certain embodiments, sub-groups of the active LED structure mesas 12' may be coupled together by a common p-contact 32 and/or second reflective layer 24 that would extend across streets as illustrated in FIG. 1A, for example. In such embodiments, the sub-groups of the active LED structure mesas 12' may be individually addressable with respect to one another. As with other embodiments, the LED chip 60 may be arranged for flip-chip mounting such that a primary emission face 60'' for the LED chip 60 is formed at a surface of the substrate that is opposite the p-contact 32 and a mounting face 60'.

Figure 22:
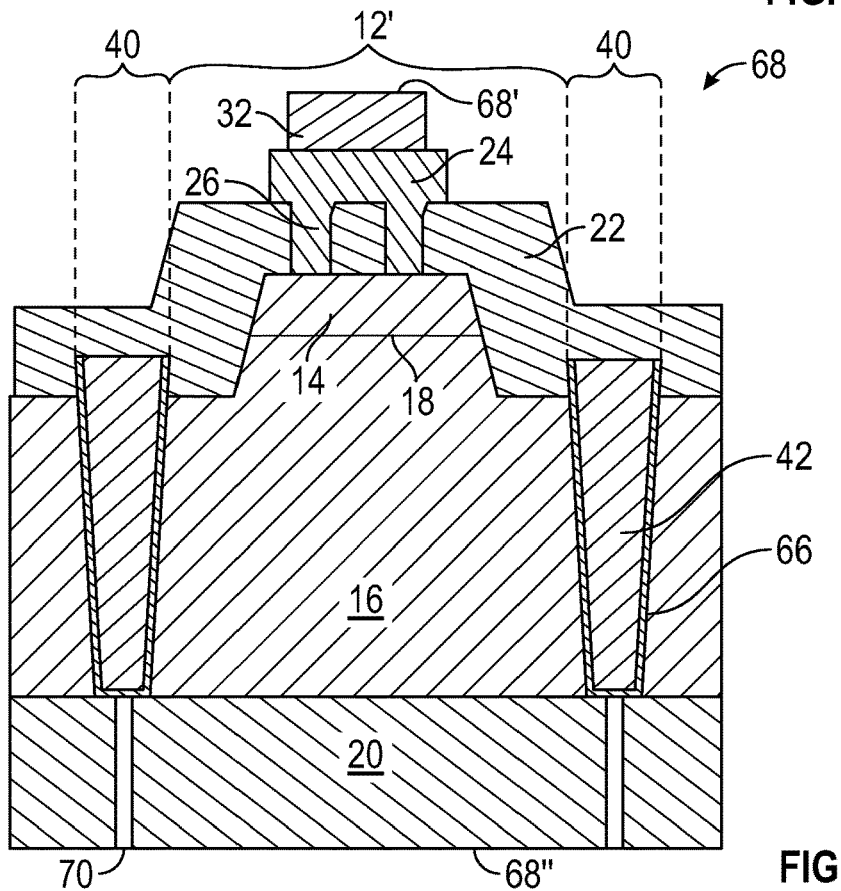
FIG. 22 is a cross-sectional view of a portion of an LED chip that is similar to the LED chip of FIG. 21B and further includes light-contrasting features that are provided in areas of the substrate that are registered with the n-contact structure.

FIG. 22 is a cross-sectional view of a portion of an LED chip 68 that is similar to the LED chip 60 of FIGS. 16A to 21B and further includes light-contrasting features 70 that are provided in areas of the substrate 20 that are registered with the n-contact structure 42. In this manner, the light-contrasting features 70 may be aligned or otherwise registered with the streets 40 that are between adjacent active LED structure mesas 12'. By arranging the light-contrasting features 70 in the streets 40, and in alignment with the n-contact structure 42, the light-contrasting features 70 may reduce light emissions that may otherwise propagate laterally within the substrate 20 and between adjacent active LED structure mesas 12'. Since the n-contact structure 42 also reduces laterally propagating light between the active LED structure mesas 12', the combined structure of the light-contrasting features 70 and the n-contact structure 42 provides vertical barriers for lateral light that extend entirely through the active LED structure mesas 12' and through one or more portions of the substrate 20. In certain embodiments, the light-contrasting features 70 may be regions of the substrate 20 that are intentionally damaged to reduce light transmissivity. For example, the light-contrasting features 70 may comprise damaged regions formed by focused laser emissions that are applied within subsurface regions of the substrate 20 along the streets 40. In still further embodiments, the damaged regions may form cracks or cut lines in the substrate 20 that correspond with openings in the substrate 20 from a light-emitting surface 68'' of the LED chip 68. Such openings may also provide increased contrast between adjacent active LED structure mesas 12' since emissions may not readily travel across the light-contrasting features 70 in a lateral manner between active LED structure mesas 12'. The light-contrasting features 70 may comprise openings in the substrate 20 that are subsequently filled with another material with increased light-absorbing properties as compared with the substrate 20. For any of the above-described embodiments, the light-contrasting features 70 may be arranged to extend entirely through the substrate 20 or partially through a thickness of the substrate 20. While the light-contrasting features 70 are described in the context of FIG. 22, the light-contrasting features 70 may also be present in any of the previous embodiments as described for FIGS. 1A to 21B.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) chip, comprising:
an active LED structure comprising an n-type layer, a p-type layer, and an active layer arranged between the n-type layer and the p-type layer;
a reflective structure on the active LED structure, wherein the reflective structure comprises a dielectric layer, a metal layer, and a plurality of reflective layer interconnects that extend through the dielectric layer to electrically couple the metal layer to the p-type layer; and
an n-contact structure electrically coupled to the n-type layer, wherein a portion of the n-contact structure is arranged on the n-type layer in a position that is between the n-type layer and at least a portion of the dielectric layer of the reflective structure, wherein the portion of the dielectric layer covers the portion of the n-contact structure on the n-type layer.

2. The LED chip of claim 1, wherein:
the p-type layer, the active layer, and a first portion of the n-type layer form an active LED structure mesa with at least one street formed by a second portion of the n-type layer that is outside the active LED structure mesa; and
at least a portion of the n-contact structure is arranged on the at least one street.

3. The LED chip of claim 1, wherein:
the p-type layer, the active layer, and the n-type layer form a plurality of active LED structure mesas that are separated by a plurality of streets formed by portions of the n-type layer that are outside the plurality of active LED structure mesas; and
at least a portion of the n-contact structure forms an n-contact grid that resides in the plurality of streets.

4. The LED chip of claim 3, wherein the dielectric layer of the reflective structure is arranged to laterally extend across one or more streets of the plurality of streets.

5. The LED chip of claim 3, wherein the n-contact grid forms a repeating pattern across the n-type layer.

6. The LED chip of claim 3, wherein reflective layer interconnects of the plurality of reflective layer interconnects arranged along each active LED structure mesa are arranged with different diameters from one another.

7. The LED chip of claim 3, wherein the plurality of active LED structure mesas are electrically coupled in parallel with one another.

8. The LED chip of claim 3, wherein one or more active LED structure mesas of the plurality of active LED structure mesas are configured to be electrically activated and deactivated independently of one another.

9. The LED chip of claim 1, further comprising:
an n-contact electrically coupled to the n-type layer;
a p-contact electrically coupled to the p-type layer; and
a passivation layer arranged between the n-contact and the active LED structure and between the p-contact and the active LED structure.

10. The LED chip of claim 9, further comprising:
a plurality of p-contact interconnects that form electrically conductive paths through the passivation layer to electrically couple the p-contact to the metal layer; and
a plurality of n-contact interconnects that form electrically conductive paths through the passivation layer to electrically couple the n-contact to the n-contact structure.

11. The LED chip of claim 10, further comprising an interlayer that is embedded within the passivation layer such that the interlayer is electrically isolated from the n-contact and the p-contact, wherein a peripheral edge of the interlayer is arranged closer to an n-contact interconnect of the plurality of n-contact interconnects than a peripheral edge of the metal layer.

12. A light-emitting diode (LED) chip, comprising:
an active LED structure comprising an n-type layer, a p-type layer, and an active layer arranged between the n-type layer and the p-type layer;
an n-contact electrically coupled to the n-type layer;
a p-contact electrically coupled to the p-type layer;
an n-contact grid electrically coupled between the n-contact and the n-type layer, wherein a portion of the n-contact grid is arranged between the n-type layer and the p-contact; and
a dielectric layer on the n-contact grid such that at least a portion of the dielectric layer is arranged between the n-contact grid and the p-contact.

13. The LED chip of claim 12, wherein the dielectric layer forms a portion of a reflective structure, wherein the reflective structure further comprises a metal layer and a plurality of reflective layer interconnects that extend through the dielectric layer to electrically couple the metal layer to the p-type layer.

14. The LED chip of claim 12, wherein:
the p-type layer, the active layer, and the n-type layer form a plurality of active LED structure mesas that are separated by a plurality of streets formed by portions of the n-type layer that are outside the plurality of active LED structure mesas; and
the n-contact grid resides in the plurality of streets.

15. The LED chip of claim 14, further comprising at least one n-contact interconnect that is electrically coupled between the n-contact and the n-contact grid.

16. The LED chip of claim 14, wherein the dielectric layer laterally extends from the plurality of active LED structure mesas across the plurality of streets.

17. The LED chip of claim 14, wherein the n-contact grid forms a repeating pattern across the n-type layer.

18. The LED chip of claim 17, further comprising a plurality of n-contact interconnects that are electrically coupled between the n-contact and the n-contact grid, wherein the plurality of n-contact interconnects are arranged to contact the n-contact grid at vertices of the repeating pattern.

19. The LED chip of claim 12, wherein the n-contact is accessible from a light-emitting face of the LED chip and the p-contact is accessible from a mounting face of the LED chip that is opposite the light-emitting face.

20. The LED chip of claim 12, wherein the p-contact is accessible from a light-emitting face of the LED chip and the n-contact is accessible from a mounting face of the LED chip that is opposite the light-emitting face.

21. A light-emitting diode (LED) chip, comprising:
an active LED structure comprising an n-type layer, a p-type layer, and an active layer arranged between the n-type layer and the p-type layer, wherein the p-type layer, the active layer, and the n-type layer form a plurality of active LED structure mesas that are separated by a plurality of streets;
an n-contact structure that is arranged within the plurality of streets such that the n-contact structure is electrically coupled to sidewalls of the n-type layer of each active LED structure mesa of the plurality of active LED structure mesas; and
a reflective structure on the plurality of active LED structure mesas, wherein the reflective structure comprises: a dielectric layer, a metal layer, and a plurality of reflective layer interconnects that extend through the dielectric layer to electrically couple the metal layer to the p-type layer of each of the plurality of active LED structure mesas;
wherein the dielectric layer laterally extends across the plurality of streets and the n-contact structure such that the dielectric layer laterally extends between adjacent ones of the plurality of active LED structure mesas.

22. The LED chip of claim 21, wherein the n-contact structure is arranged entirely through a thickness of the n-type layer.

23. The LED chip of claim 21, further comprising a plurality of p-contacts, wherein an individual p-contact of the plurality of p-contacts is electrically coupled to an individual active LED structure mesa of the plurality of active LED structure mesas.

24. The LED chip of claim 21, further comprising a substrate on which the active LED structure is provided, wherein the substrate further comprises light-contrasting features that are registered with the plurality of streets.

25. The LED chip of claim 24, wherein the light-contrasting features comprise damaged regions of the substrate.

26. The LED chip of claim 25, wherein the light-contrasting features comprise openings of the substrate.

27. The LED chip of claim 26, wherein the openings of the substrate are filled with a light-absorbing material.

28. A light-emitting diode (LED) chip, comprising:
an active LED structure comprising an n-type layer, a p-type layer, and an active layer arranged between the n-type layer and the p-type layer, wherein the p-type layer, the active layer, and the n-type layer form a plurality of active LED structure mesas that are separated by a plurality of streets;

an n-contact structure that is arranged within the plurality of streets such that the n-contact structure is electrically coupled to sidewalls of the n-type layer of each active LED structure mesa of the plurality of active LED structure mesas; and a substrate on which the active LED structure is provided, the substrate comprising light-contrasting features registered with the plurality of streets.

29. The LED chip of claim 28, wherein the light-contrasting features comprise damaged regions of the substrate.

30. The LED chip of claim 29, wherein the light-contrasting features comprise openings of the substrate.

31. The LED chip of claim 30, wherein the openings of the substrate are filled with a light-absorbing material.

* * * * *